US009099592B2

(12) United States Patent
Derryberry et al.

(10) Patent No.: US 9,099,592 B2
(45) Date of Patent: *Aug. 4, 2015

(54) OPTICAL ELEMENT PRODUCING A MODULATED REGION OF INCREASED LIGHT INTENSITY AND OPTICALLY ENHANCED PHOTOVOLTAIC CELL AND LED LIGHTING DEVICE INCLUDING THE SAME

(75) Inventors: Rebekah Ann Derryberry, Wilmington, DE (US); Roger Harquail French, Cleveland Heights, OH (US); Mark E. Lewittes, Wilmington, DE (US); Ronald Jack Riegert, Newark, DE (US); Jose Manuel Rodriguez-Parada, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 490 days.

This patent is subject to a terminal disclaimer.

(21) Appl. No.: 13/180,614

(22) Filed: Jul. 12, 2011

(65) Prior Publication Data
US 2012/0069580 A1 Mar. 22, 2012

Related U.S. Application Data

(60) Provisional application No. 61/363,758, filed on Jul. 13, 2010, provisional application No. 61/363,764, filed on Jul. 13, 2010, provisional application No. 61/363,769, filed on Jul. 13, 2010, provisional (Continued)

(51) Int. Cl.
*F21V 3/00* (2006.01)
*G02B 3/00* (2006.01)
*H01L 31/054* (2014.01)

(52) U.S. Cl.
CPC .......... *H01L 31/0543* (2014.12); *G02B 3/0043* (2013.01); *G02B 3/0056* (2013.01); *Y02E 10/52* (2013.01)

(58) Field of Classification Search
CPC .............. G02B 3/0043; G02B 3/0056; H01L 31/0524; H01L 31/054; H01L 31/0543; Y02E 10/52
USPC ...................... 362/311.02; 359/652
See application file for complete search history.

(56) References Cited

U.S. PATENT DOCUMENTS

| 4,053,327 A | 10/1977 | Meulenberg, Jr. |
| 4,379,202 A | 4/1983 | Chalmers |

(Continued)

FOREIGN PATENT DOCUMENTS

WO 91/20097 12/1991

*Primary Examiner* — Tamir Ayad

(57) ABSTRACT

An optical element has a plano-plano body formed of a first material having a greater refraction index $n_1$ and a second material having a lesser refraction index $n_2$. Both indices are greater than one. The absolute value of the index contrast, $\log_{10}(n_1/n_2)$, is in the range from about 0.001 to about 0.17, preferably from about 0.01 to about 0.05. The materials have an induced absorbance rate $\Delta Abs/Dose$ less than or equal to about 0.4, preferably less than or equal to about 0.2. The materials are arranged such that an interface with at least one cusp is defined therebetween. The cusp has an apex pointed toward the material having the greater index of refraction. The cusp is operative to produce a region of increased light intensity on one surface of the optical element in response to light incident on the other surface of the optical element.

12 Claims, 27 Drawing Sheets

Related U.S. Application Data application No. 61/363,773, filed on Jul. 13, 2010, provisional application No. 61/363,778, filed on Jul. 13, 2010, provisional application No. 61/363,784, filed on Jul. 13, 2010.

(56) References Cited

U.S. PATENT DOCUMENTS

| | | |
|---|---|---|
| 4,711,972 A | 12/1987 | O'Neill |
| 5,019,176 A | 5/1991 | Brandhorst, Jr. et al. |
| 5,076,857 A | 12/1991 | Nowlan |
| 5,098,482 A | 3/1992 | Warfield |
| 5,110,370 A | 5/1992 | Vogeli |
| 5,554,229 A | 9/1996 | Vogeli |
| 6,077,722 A * | 6/2000 | Jansen et al. ............ 438/74 |
| 2005/0002095 A1* | 1/2005 | Hibi et al. ............ 359/460 |
| 2006/0201545 A1* | 9/2006 | Ovshinsky et al. ........ 136/251 |
| 2006/0285359 A1* | 12/2006 | Yang et al. ............ 362/615 |
| 2008/0238310 A1* | 10/2008 | Forrest et al. .......... 313/506 |
| 2009/0056787 A1* | 3/2009 | Johnson et al. ......... 136/246 |
| 2010/0147375 A1 | 6/2010 | Korech et al. |

\* cited by examiner

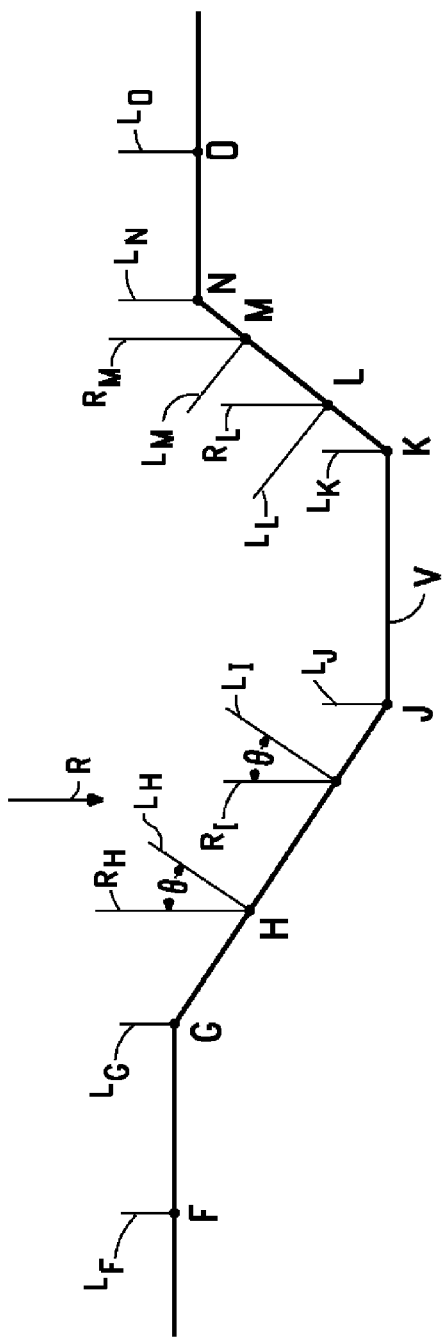
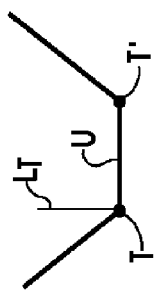
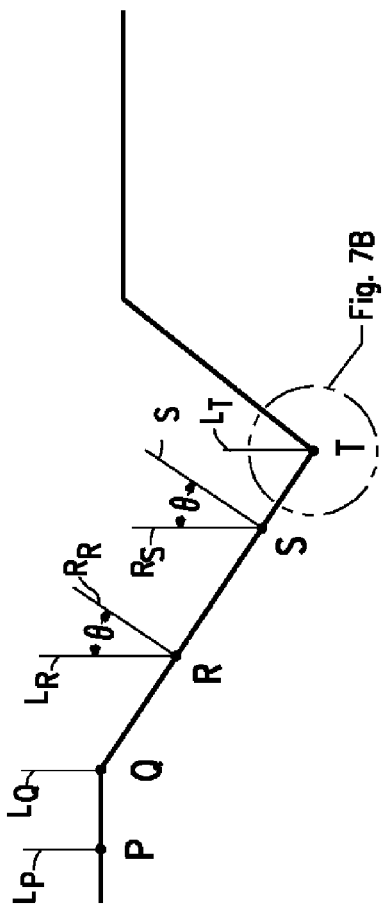
FIG. 6
FIG. 7A
FIG. 7B

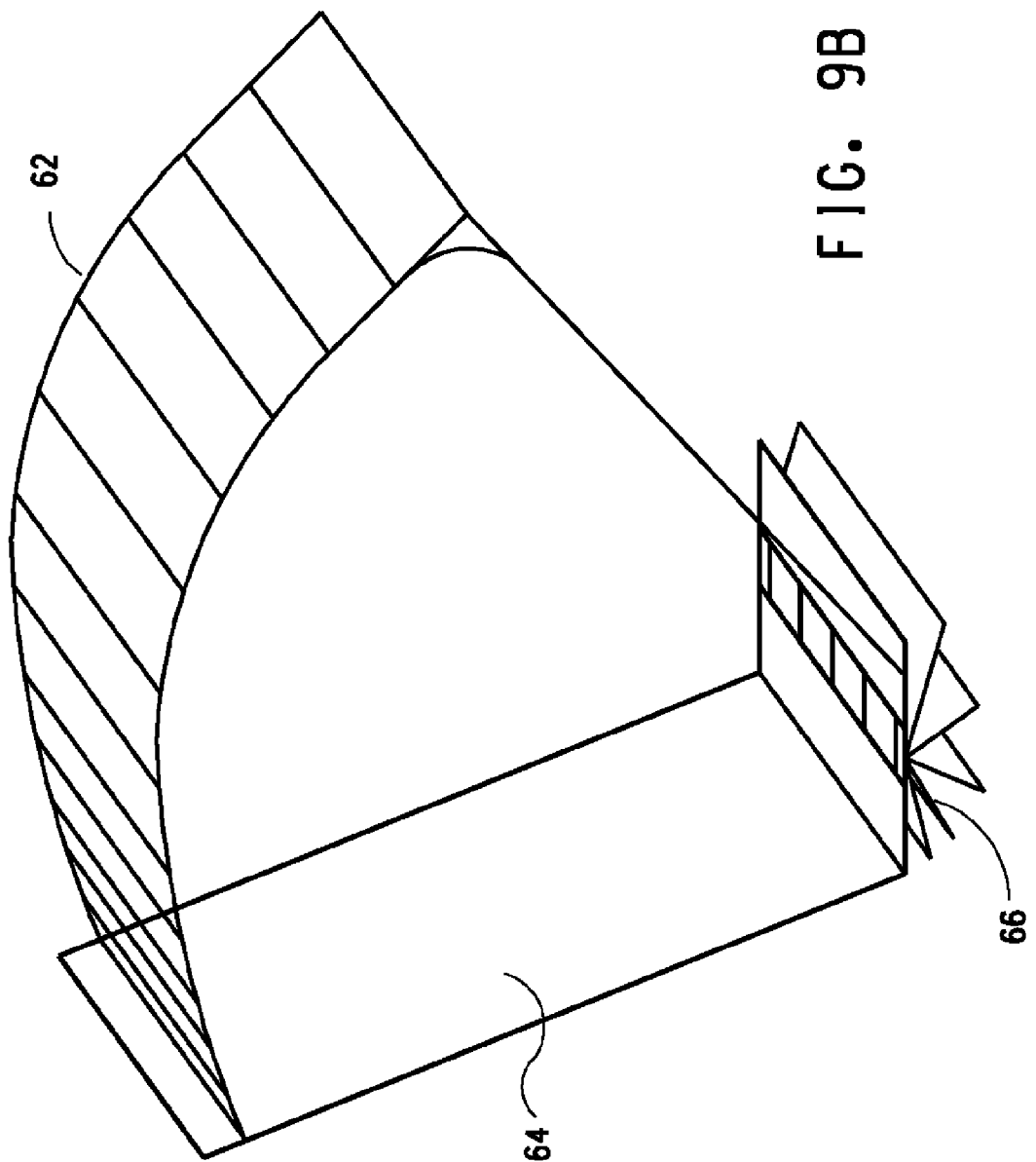

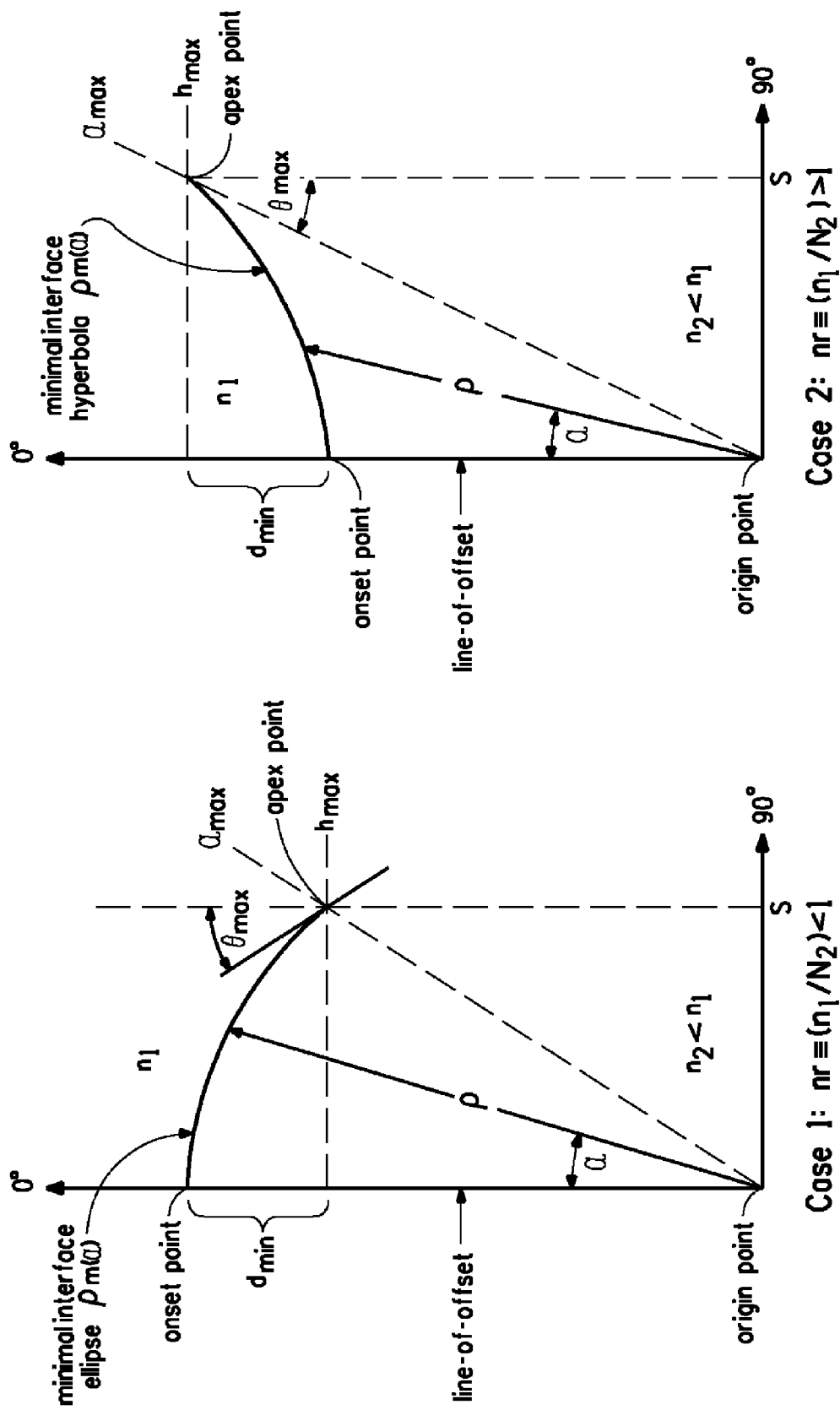

OPTICAL ELEMENT PRODUCING A MODULATED REGION OF INCREASED LIGHT INTENSITY AND OPTICALLY ENHANCED PHOTOVOLTAIC CELL AND LED LIGHTING DEVICE INCLUDING THE SAME

CLAIM OF PRIORITY

This application claims priority from each of the following United States Provisional Applications, each of which is hereby incorporated by reference:

(1) Optical Element Producing A Modulated Region of Decreased Light Intensity, Application Ser. No. 61/363,758, filed 13 Jul. 2010 (CL-4997);

(2) Optical Element Producing A Modulated Region of Increased Light Intensity, Application Ser. No. 61/363,764, filed 13 Jul. 2010 (CL-5148);

(3) Optically Enhanced Photovoltaic Cell Including An Optical Element Producing A Modulated Region of Decreased Light Intensity, Application Ser. No. 61/363,769, filed 13 Jul. 2010 (CL-5149);

(4) A Display Device Including An Optical Element Producing A Modulated Region of Increased Light Intensity, Application Ser. No. 61/363,773, filed 13 Jul. 2010 (CL-5150);

(5) An LED Lighting Device Including An Optical Element Producing A Modulated Region of Increased Light Intensity, Application Ser. No. 61/363,778, filed 13 Jul. 2010 (CL-5158); and (6) Photovoltaic Apparatus Including An Optical Element Producing A Modulated Region of Light Intensity, Application Ser. No. 61/363,784, filed 13 Jul. 2010 (CL-5159).

CROSS-REFERENCE TO RELATED APPLICATIONS

Subject matter disclosed herein is disclosed in the following applications, all filed contemporaneously herewith and all assigned to the assignee of the present invention:

Optical Element Having Internal Inclusions Configured For Maximum Conversion Efficiency, application Ser. No. 13/180,628, filed Jul. 12, 2011 (CL-5294, a cognate of CL-5294 and CL-5444), now U.S. Patent No. 8,441,735;

Photovoltaic Assemblies Incorporating An Optical Element Having Internal Inclusions Configured For Maximum Conversion Efficiency, application Ser. No. 13/180,638, filed Jul. 12, 2011 (CI-5443, a cognate of CL-5443 and CL-5445), now U.S. Patent No. 8,648,248;

Optical Element Producing A Modulated Region of Decreased Light Intensity and Optically Enhanced Photovoltaic Cell Including The Same, application Ser. No. 13/180, 604, filed Jul. 12, 2011 (CL-4997, a cognate of CL-4997 and CL-5149); and Photovoltaic Apparatus Including An Optical Element Producing A Modulated Region of Light Intensity, application Ser. No. 13/180,621, filed Jul. 12, 2011 (CL-5159).

BACKGROUND OF THE INVENTION

In the area of photovoltaics, the active photovoltaic ("PV") cell in many cases has metallic conductor lines on the front, sun-facing, surface of the cell. These conductor lines are essential to the electrical circuit of which the PV cell is an element. However, at the same time, these front side metallic conductor lines cause a portion of the incident solar radiation to be blocked from entering the active semiconductor absorber materials in the cell, and therefore do not contribute to the photovoltaic current produced by the cell.

These optical losses in photovoltaic conversion due to the presence of front side conductor lines are found in many different types of photovoltaics, from PV modules designed for use at 1 kW/m$^2$ irradiance (where 1 kW/m$^2$ is approximately the irradiance of the sun at the surface of the earth) to concentrating photovoltaic ("CPV") modules in which the solar radiation is concentrated to 5, 50, or even greater than 500 times the irradiance of the sun and focused on higher efficiency PV cells.

In an effort to overcome the loss of electrical power from the PV module due to obscuration of the front side of the PV cell by the front side conductors some PV cells dispose all the cell conductor lines away from the front side of the PV cell. These approaches are typically referred to as "back side contacting PV cells", and require extensive redesign of the PV cell with increased complexity and cost.

In others areas, such as in LCD display devices and LED lighting devices, there is a need to decrease the spatial modulation of light to provide more uniform illumination from the devices.

Accordingly, in view of the foregoing it is believed to be advantageous to provide an article in the form of an optical element which could be used in conjunction with a photovoltaic, LCD and/or LED device and which serves to harvest substantially all of the radiation incident on the article and which is also able to redirect that incident light toward or away from certain regions of interest on the device.

Such an article, when used in conjunction with a photovoltaic cell, could redirect the light away from the front side conductor lines and towards the active semiconductor materials of the PV cell, so that this light will contribute to the electrical output of a PV cell, module and system.

When used in conjunction with an LCD display and/or LED lighting device, such an article could be used to provide more uniform illumination in otherwise dark regions of the LCD display device. In the LED lighting case the optical element may be used to make the point source-like-nature of the LED more homogeneous and uniform.

-o-0-o

Considering again the area of photovoltaics, in addition to the matter of light collection efficiency discussed above, another critical consideration is radiation durability.

Radiation durability refers to the ability of a material from which an article is made, to withstand a predetermined level of irradiance for the desired lifetime of the article. Thus, a flat plate module (i.e., a module designed for use at 1 kW/m$^2$ irradiance) must be able to withstand an irradiance of 1 KW/m$^2$ of solar radiation for the desired lifetime (typically twenty-five years) of the PV module and system.

In the case of CPV modules the radiation durability requirements are more stringent since for an identical lifetime, the irradiance of light is much higher, and the total dose of solar radiation into the materials on the front side of the PV cell in concomitantly larger, by the concentration factor.

Accordingly, is it believed to be of further advantage that an optical element that redirects light to enhance light collection efficiency is, at the same time, also radiation durable for the application and lifetime for which it is used.

SUMMARY OF THE INVENTION

An optical element article in accordance with the present invention, when utilized in PV and many other applications, satisfies the need to spatially modulate the intensity of light while exhibiting the requisite radiation durability for the application. The optical element has a plano-piano structure, i.e., it has two flat exterior surfaces. Owing to the configuration of the internal interface between the two materials forming the optical element, light incident on one side of the optical element is spatially modulated as a result of traveling through the plano-plano optical element.

The plano-piano nature of the optical element enables it to be incorporated on to a diverse number of different PV cells, and then to be integrated into the rest of the PV module, without requiring redesign of the module. In addition, the plano-piano nature of the optical element article means that it can be easily incorporated with other optical elements, such as secondary optics of the homogenizer or concentrator types used in CPV applications. These can also be easily incorporated into other optical systems with minimal io configuration changes to the system.

The optical element is made from two materials, each with a respective index of refraction. One index of refraction is greater than the other index of refraction, with both indices of refraction being greater than the index of refraction of air. The internal interface between the first and second materials is arranged such that an interface with at least one, but more preferably a plurality, of cusp(s) is defined therebetween. Based upon the direction in which the apex of the cusp(s) are oriented, each cusp produces a region of modulated light, with the desired width and periodicity of the modulated regions, on the side of the optical element opposite to the incident light side.

Due to the difference in indices of refraction, an index contrast parameter "c" is defined between the two materials, where c defined by the relationship $$c = \log_{10} n_R, \text{ where } n_R = (n_1/n_2).$$

In accordance with the present invention materials forming the optical element are selected such that the absolute value of index contrast "c" lies within the range from about 0.001 to about 0.17, and more preferably, in the range from about 0.01 to about 0.05.

Materials forming the optical element are also selected to provide sufficient radiation durability, that is, lifetime at the irradiance of the application (from 1 KW/m² to >500 KW/m² concentration). These material selections are made based on the induced absorbance rate (ΔAbs/Dose) of the different materials at the required irradiance level of the application. In accordance with the invention the materials have an induced absorbance rate (ΔAbs/Dose) less than or equal to about 0.4, and more preferably, less than or equal to about 0.2.

BRIEF DESCRIPTION OF THE DRAWINGS

The invention may be more fully understood from the following detailed description, taken in connection with the accompanying drawings, which form part of this application and in which:

FIG. 5A is stylized pictorial representation viewed in a vertical plane illustrating one example of an arbitrary configuration of a cusp, while

FIG. 6 is stylized pictorial representation viewed in a vertical plane illustrating another example of an arbitrary configuration of a cusp;

FIG. 7A is stylized pictorial representation viewed in a vertical plane illustrating yet another example of an arbitrary configuration of a cusp, while FIG. 7B is an enlarged view of the circled portion at the apex of the cusp in FIG. 7A;

FIGS. 9A through 9C illustrate stylized schematic representations of low, medium and high concentration CPV modules, respectively, that include an optical element in accordance with the present invention;

FIG. 12A is a definitional drawing illustrating the geometrical parameters for a dark line optical element in accordance with the present invention in which material 1 has the lower index of the pair of materials $(n_1/n_2) < 1$;

FIG. 12B is a definitional drawing similar to FIG. 12A illustrating the geometrical parameters for a dark line optical element in accordance with the present invention in which material 1 has the higher index of the pair of materials $(n_1/n_2) > 1$;

FIG. 14A is a three-dimensional rendering of the structure of the optical element of Example 12, while

FIG. 15A is a three-dimensional rendering of the structure of the optical element of Example 13, while

FIG. 16A is a three-dimensional rendering of the structure of the optical element of Example 14, while

FIG. 17A is a three-dimensional rendering of the a portion of a Reflexite® film used in Example 15, while

DETAILED DESCRIPTION OF THE INVENTION

Figure 1A:
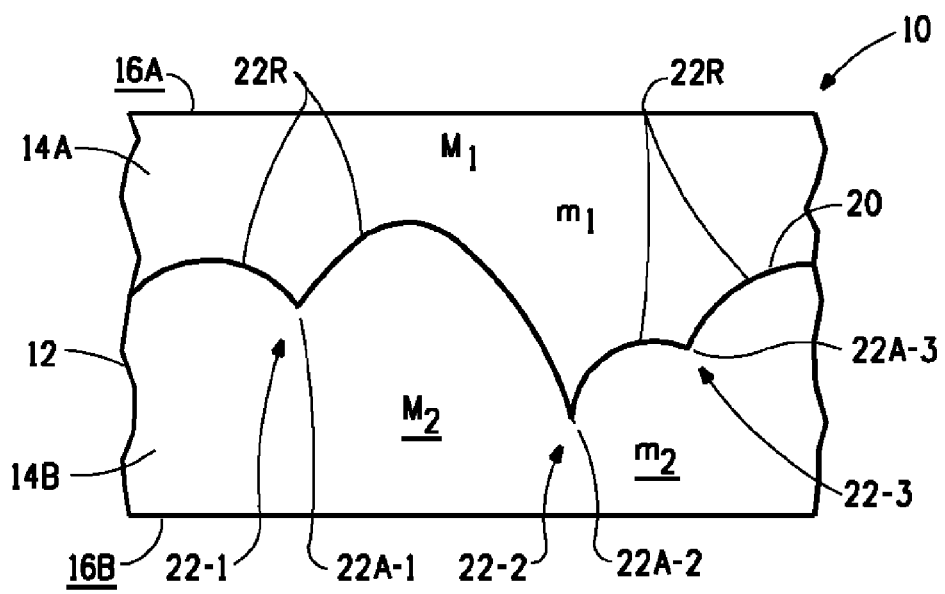
FIGS. 1A and 1B are, respectively, a stylized pictorial front section view and a side elevation view of an optical element article in accordance with one embodiment of the present invention.

Throughout the following detailed description similar reference numerals refer to similar elements in all figures of the drawings.

Figure 1B:
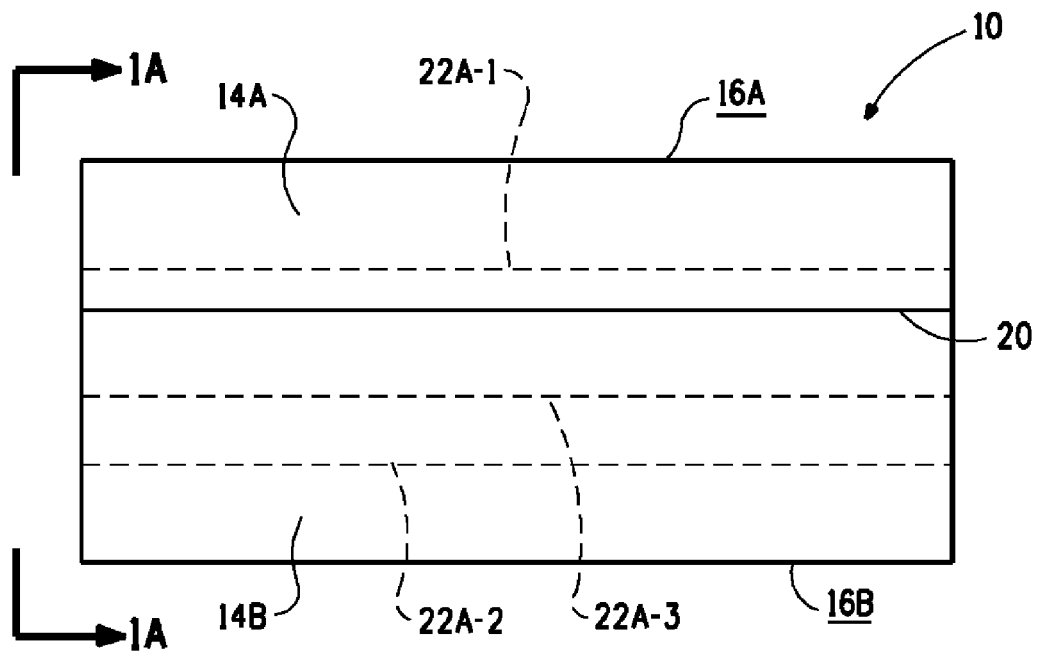
Figure 3A:
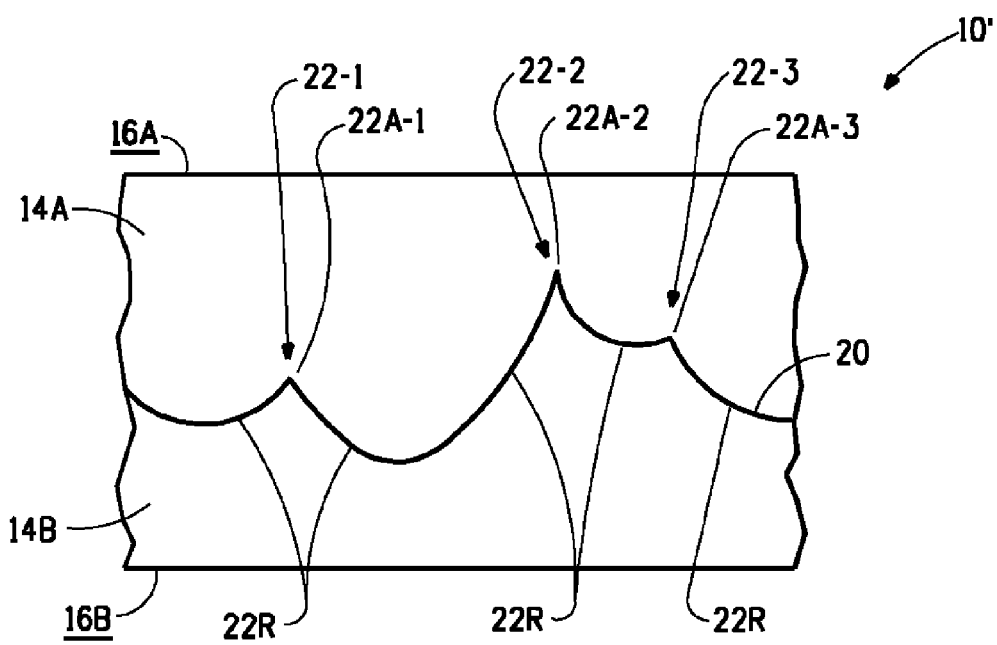
FIGS. 3A and 3B are, respectively, a stylized pictorial front section view and a side elevation view (similar to FIGS. 1A, 1B) of an optical element article in accordance with a second embodiment of the present invention.
Figure 3B:
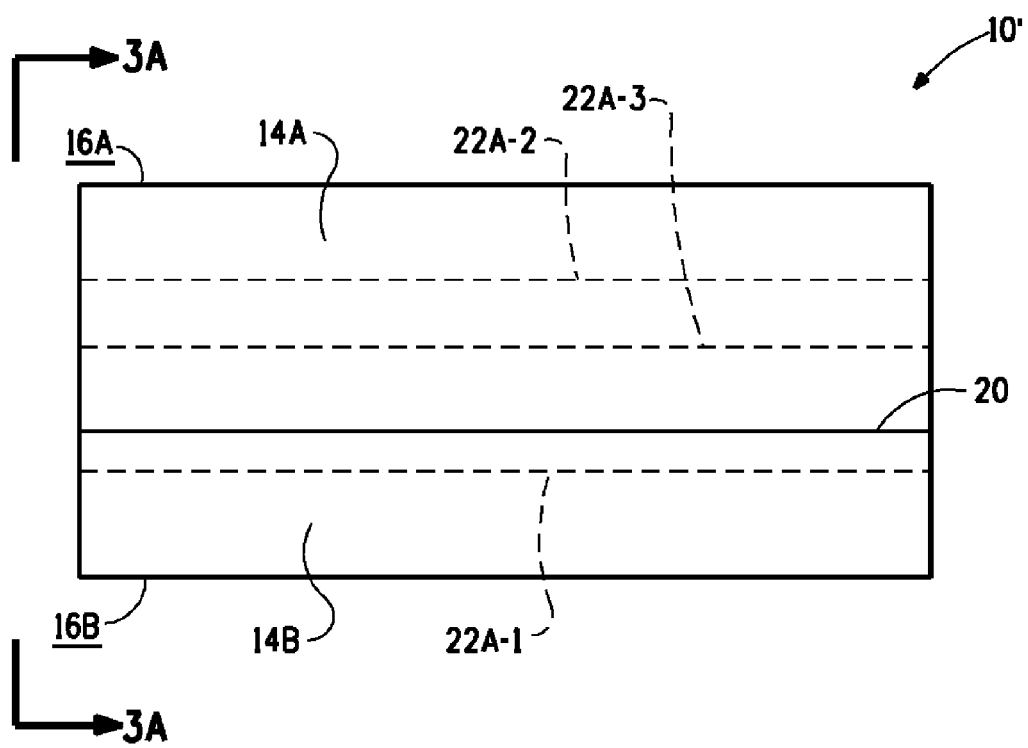

With reference to FIGS. 1A, 1B and FIGS. 3A, 3B shown are stylized pictorial representations of two optical element articles, generally indicated by the reference characters 10 and 10', respectively, each in accordance with the present invention. The optical element 10, 10' may also be referred to herein as "CLOE". FIGS. 1A and 3A are front elevation views of the articles 10, 10' while FIGS. 1B and 3B are corresponding side elevation views thereof. Although FIGS. 1A and 3A are intended as front section views, the section lines have been omitted for clarity of illustration.

Each optical element article 10, 10' comprises a body 12 having a first portion 14A formed of a first material $M_1$ and a second portion 14B formed of a second material $M_2$. Each material has a respective index of refraction $n_1$ and $n_2$. One index of refraction is greater than the other index of refraction, with both indices of refraction being greater than the index of refraction of air.

A useful parameter for later discussion is the index contrast parameter "c" defined between the two materials, where c given by the relationship:

$$c = \log_{10} n_R, \text{ where } n_R = (n_1/n_2).$$

The body 12 may assume any generalized three-dimensional shape so long as it includes first and second substantially planar, opposed major surfaces 16A, 16B, thereby defining a plano-piano optical element. In the preferred instances the major surfaces 16A, 16B are substantially parallel to each other, but this orientation is not required. That is to say, the surfaces 16A, 16B may be inclined with respect to each other.

The first material and the second material are arranged within each optical element 10, 10' such that an interface 20 is defined through the optical element between the first and second materials $M_1$ and $M_2$. In the arrangements illustrated in FIGS. 1 and 3, the interface 20 extends throughout the entire length and breadth of the body of the optical element.

The interface 20 is configured to exhibit one or more cusp(s) generally indicated by the reference character 22. In FIGS. 1A and 3A three such cusps 22-1, 22-1, 22-3 are shown. Any convenient number of cusps may be formed along the interface, as will be developed.

The cusps 22 may take any convenient form. In the arrangements illustrated in FIGS. 1A, 3A the cusps define linear features that extend axially through the entire body of the optical element (i.e., into the plane of FIGS. 1A, 3A). Alternatively, however, the cusps may extend sinuously along the axial direction of the entire body.

Figure 1C:
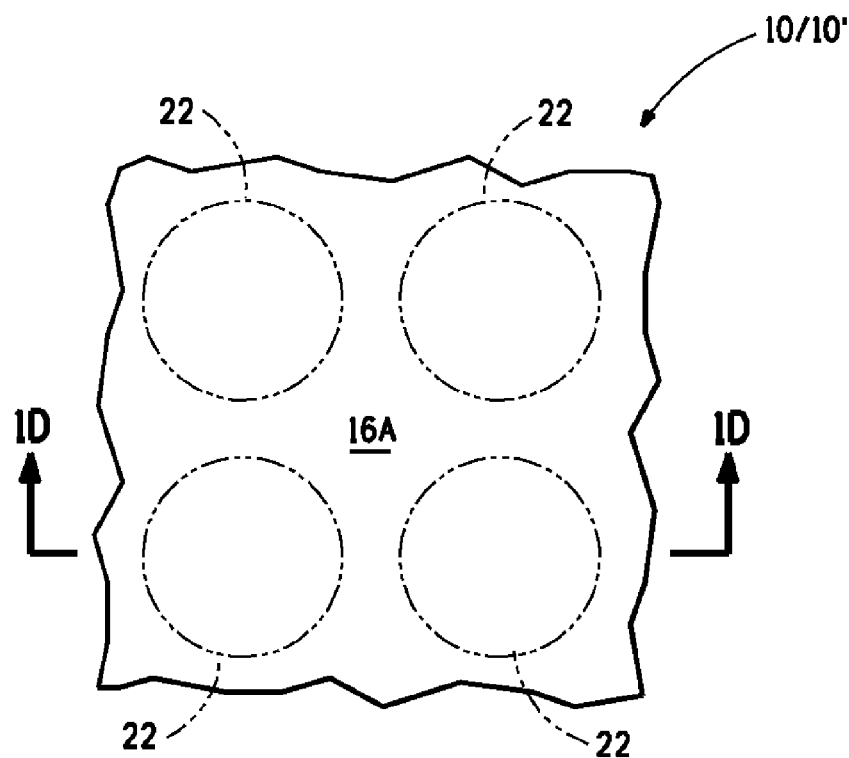
FIGS. 1C and 1D are diagrammatic plan and section views showing an alternative arrangement of the optical element wherein the cusps are formed as closed features within the body of the element.
Figure 1D:
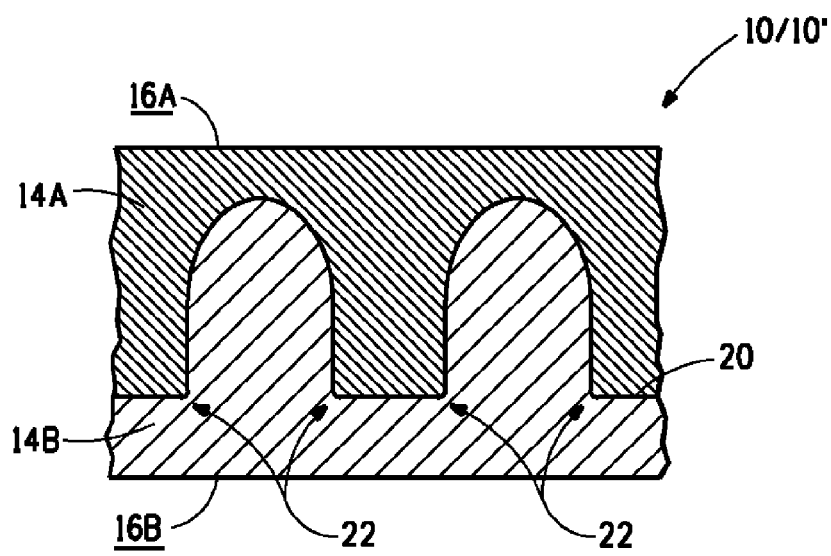

As a further alternative, as diagrammatically illustrated in FIGS. 1C and 1D, the cusps may be formed as closed features within the body, for example, appearing as rectangles, or squares, circles or ovals when the optical element 10, 10' is viewed in plan.

As a yet further alternative cusps may also be formed with finite lengths within the body.

Although a somewhat more formal definition is provided herein, in general, a cusp 22 includes a region having a contour 22R with refractive power that terminates in a generally pointed apex 22A. In accordance with the invention the apex 22A is oriented toward the portion of the body having either the first material or the second material. The direction in which the apex points is taken as the direction of the cusp. In the case illustrated in FIG. 1A each apex 22 of each cusp 22 is directed toward the portion of the body formed of the second material $M_2$. Alternatively, in the instance illustrated in FIG. 3A the apex of each cusp defined along the interface 20 therein is directed toward the portion of the body formed of the first material $M_1$.

Depending upon the relative magnitudes of the indices of refraction $n_2$ and $n_1$, the direction of the apex determines whether a modulated region of relatively higher or relatively lower light intensity is produced on one surface of material when the opposite surface of the optical element is exposed to incident radiation.

Figure 2A:
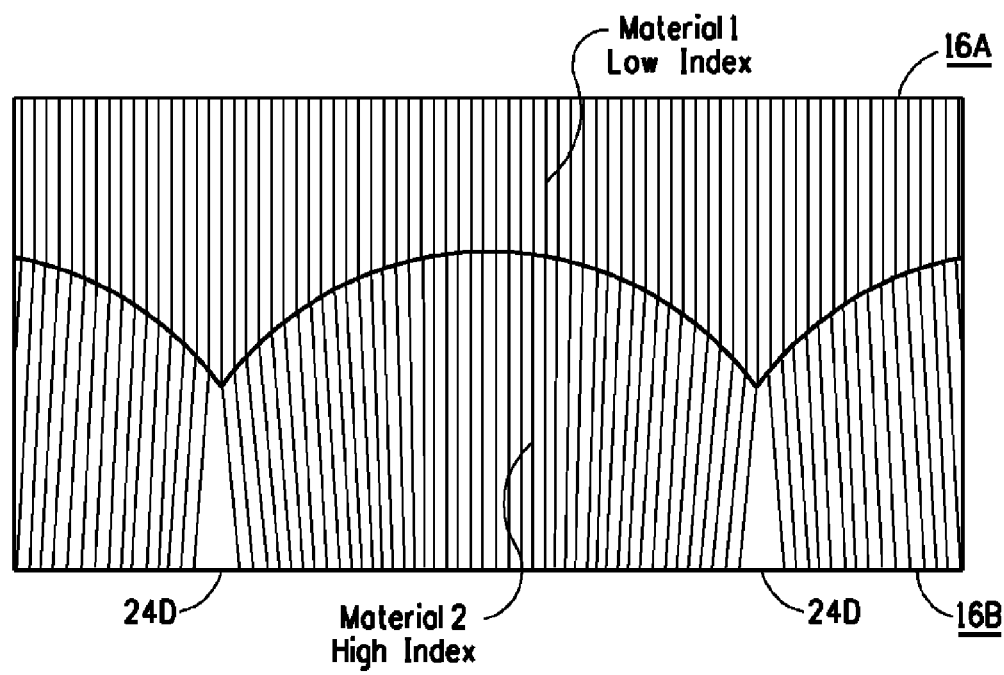
FIGS. 2A and 2B are stylized pictorial front section views showing the patterns of modulated regions of light produced by an optical element having an interface oriented as in FIG. 1A when the apices of the cusps of the interface therein are directed toward the material having the greater index of refraction and the material having the lesser index of refraction, respectively.

For example, FIG. 2A illustrates the regions of modulated light produced when an optical element whose interface is arranged in the manner shown in FIG. 1A, (i.e., with the apices of the interface directed toward the second material $M_2$). (It should be appreciated that in FIGS. 2A, 2B, 4A, 4B several representative ray paths are illustrated in the drawings, from which the action of each optical element 10, 10', as the case may be, to redirect light incident thereon may be clearly understood.) When the index of refraction $n_2$ is greater than the index $n_1$ of the first material $M_1$ the cusps 22 operate to direct light incident on the first surface 16A away from certain portions of the second surface 16B, thereby producing modulated regions 24D of relatively lesser light intensity on the second surface 16B. The modulated regions 24D of relatively lesser intensity may be referred to as "dark lines". The dark lines 24D so produced extend along the second surface of the optical element in a pattern that tracks the configuration of the cusp.

Figure 2B:
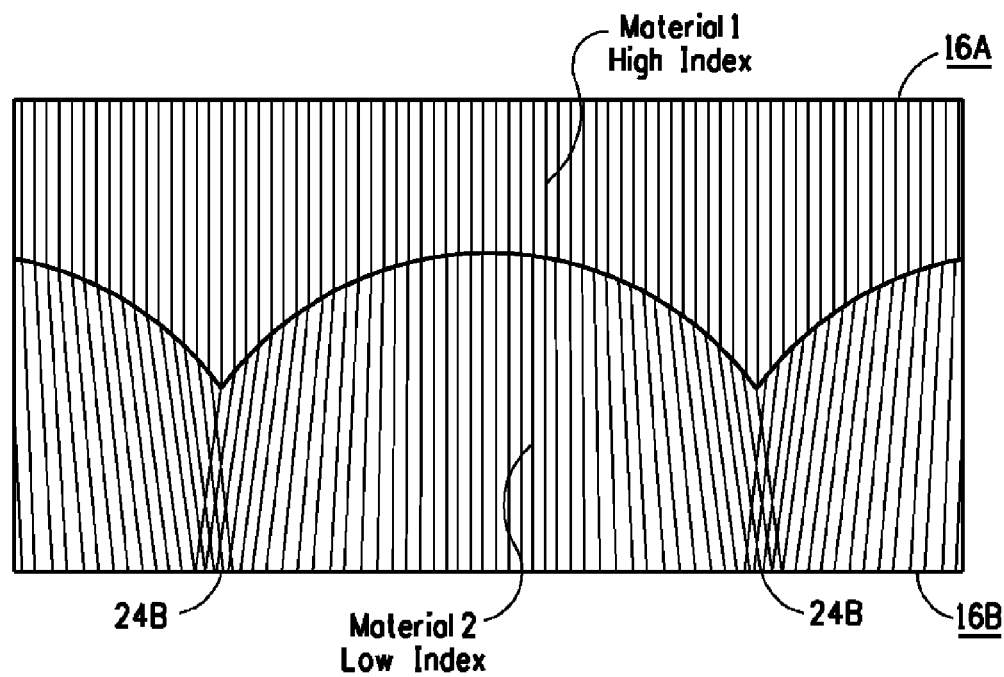

Conversely, as shown in FIG. 2B, when the index of refraction $n_2$ of the second material $M_2$ is less than the index $n_1$ of the first material $M_1$ modulated regions 24B of relatively greater intensity are produced on the second surface 16B of the element 10 when the first surface 16A thereof is exposed to incident light. The modulated regions of relatively lesser intensity may be referred to as "bright lines". The bright lines also extend along the second surface of the optical element in a pattern that tracks the configuration of the cusp.

Figure 4A:
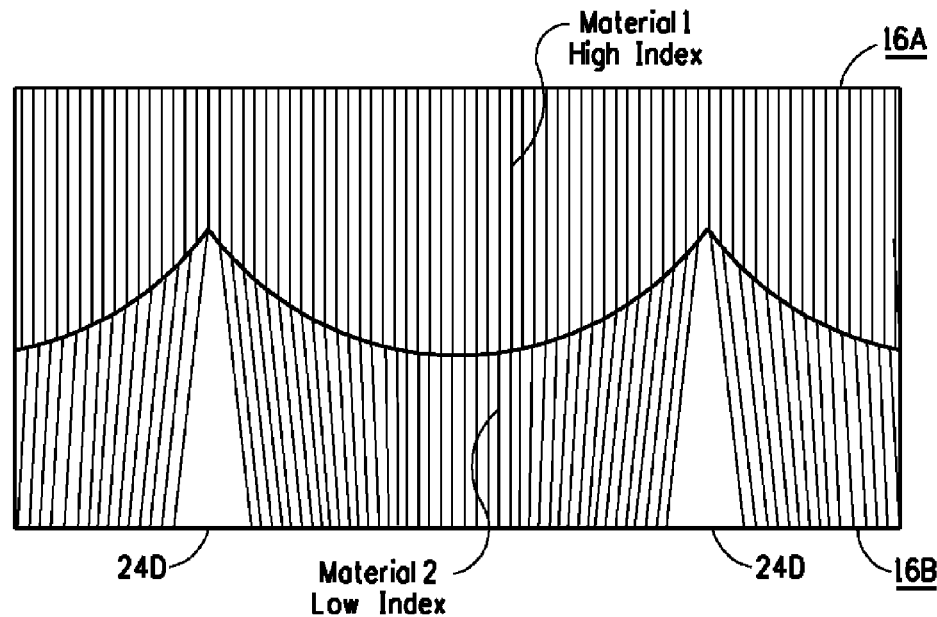
FIGS. 4A and 4B are stylized pictorial front section views similar to FIGS. 2A, 2b showing the patterns of modulated regions of light produced by an optical element having an interface oriented as in Figure sA when the apices of the cusps of the interface therein are directed toward the material having the greater index of refraction and the material having the lesser index of refraction, respectively.
Figure 4B:
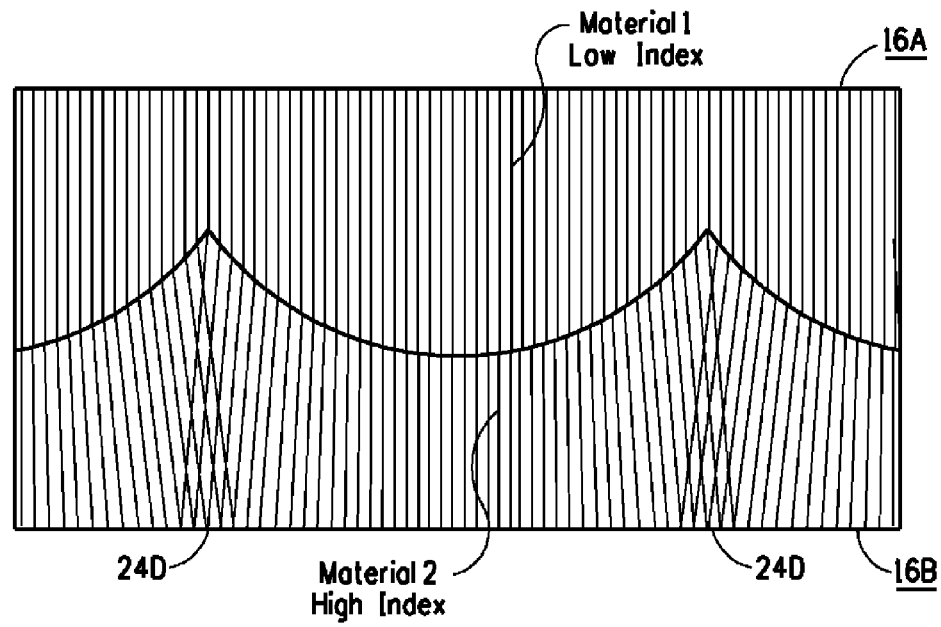

As illustrated in FIGS. 4A and 4B similar situations obtain when one surface of an optical element having the interface arranged as in FIG. 3A (apices of the interface directed toward the first material $M_1$) is exposed to incident radiation. FIG. 4A illustrates that when the index of refraction $n_1$ is greater than the index $n_2$ modulated "dark line" regions 24D (relatively lesser intensity) are produced on the second surface 16B of the element 10' when the first surface 16A thereof is exposed to incident light. When the index of refraction $n_1$ is less than the index $n_2$ modulated "bright lines" regions 24B (relatively greater light intensity) are produced on the second surface 16B of the element 10 when the first surface 16A thereof is exposed to incident light.

With reference to FIGS. 5A, 5B, 6, 7A and 7B shown are stylized cross section representations (taken along a vertical plane through the element 10, 10') of three examples of arbitrary configurations of cusps that may be formed along the interface between the first and second materials. In these Figures one surface (e.g., the first surface 16A) is substantially horizontal as viewed in the Figures, and that a reference axis R extends substantially perpendicularly to that surface.

As used in this application a cusp 22 is a portion of the interface having a refractive contour 22R that terminates in a generally pointed apex 22A. A cusp extends along the interface 20 between a first transition point and the next-adjacent transition point. A transition point may be identified as a particular point along the interface where a line perpendicular to a tangent to the interface is parallel to a reference axis R, while the perpendicular to the tangent of a point on either side of the particular point is inclined with respect to the reference axis R. The reference axis R is preferably chosen to be substantially parallel to the predominant direction of light propagation in the body. One transition point defines the onset of the cusp while the next-adjacent transition point defines the apex of the cusp.

The definition becomes clearer when the stylized representations of the various cusps shown in FIGS. 5A, 5B, FIG. 6 and FIGS. 7A, 7B are considered.

Figure 5A:
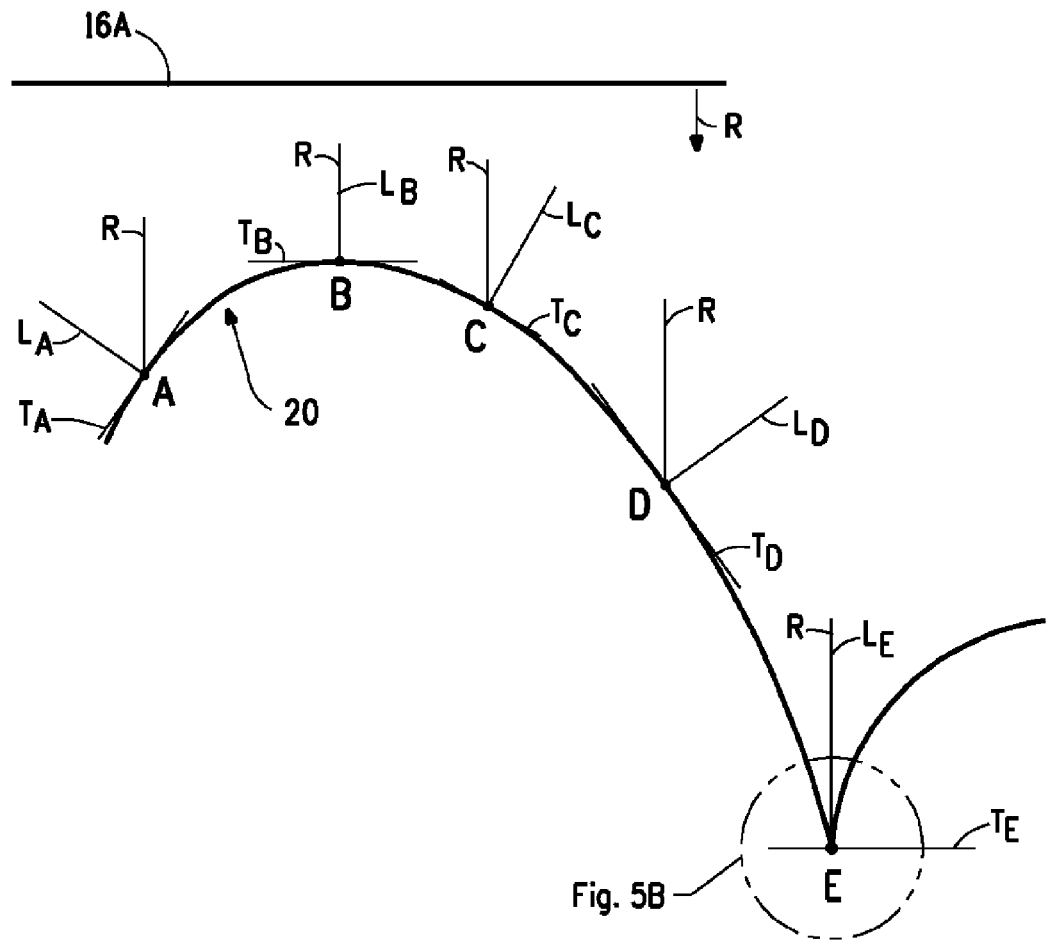
Figure 5B:
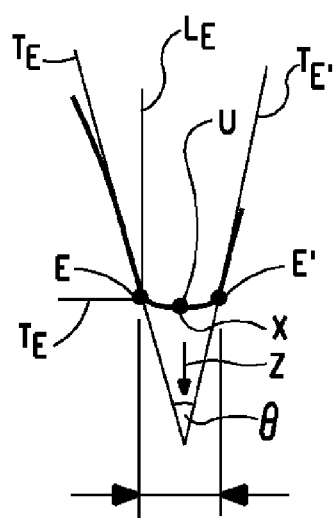
FIG. 5B is an enlarged view of the circled portion at the apex of the cusp in FIG. 5A.

In FIGS. 5A and 5B points A, B, C, D and E are identified along the interface defined within the element. Perpendicular lines $L_A$, $L_B$, $L_C$, $L_D$, and $L_E$ are erected to tangents $T_A$, $T_B$, $T_C$, $T_D$, and $T_E$ at each respective point A, B, C, D and E. It should be noted that in an actual implementation of the optical element, due to physical limitations of optical tooling and fabrication methods, the point E is not a unitary point, but is, in fact (as shown in FIG. 5B), a pair of points E, E' separated by a small interface region U. The region U could be planar, curved or arbitrarily rough.

At points A, C and D the lines $L_A$, $L_C$ and $L_D$ are inclined with respect to reference parallel lines $R_A$, $R_C$ and $R_D$ (each parallel to the reference axis R). This indicates that the contour at these points have refractive power.

However, at points B and E, the lines $L_B$ and $L_E$ align with respect to reference parallel lines $R_B$ and $R_E$. The point B thus defines a transition point because the perpendicular to the tangent at points A and C on both sides of point B are inclined with respect to the reference axis R. The point E is a transition point because at some point X in the region U the perpendicular to the tangent at point X is parallel to the reference axis.

Once adjacent transition points (e.g., points B, E) are located along the interface, each point is tested to determine whether it is to be treated an onset point of the cusp or the apex of the cusp. Two test points lying between the identified transition points are selected, one test point lying close to one transition point (e.g., point C) and the other test point lying close to the other transition point (e.g., point D). The magnitude of the angle of inclination of the perpendicular with respect to the reference axis R at each test point is compared. The adjacent test point having the greater angle of inclination (and, thus, the greater refractive power) indicates that the adjacent transition point is the apex of the cusp. The lesser angle of inclination (indicating relatively lesser refractive power) identifies that the adjacent transition point (point B) is an onset point. However, it should be noted that the point B could also be considered as an apex because the inclination angles of points near to point B do exhibit some refractive power.

In FIG. 6 points G and J are again identified as transition points. Point G is a transition point because the perpendicular to the tangent at point H on the right side of point G is inclined with respect to the reference axis R. The point J is a transition point because the perpendicular to the tangent at point I on the left side of point J is inclined with respect to the reference axis R.

However, in this instance both points G and J constitute apex points because the magnitude of the angle of inclination at the test points H and I are equal.

With respect to the rising ramp at the right side of the FIG. 6, similar reasoning shows that on the cusp having points K through O, both points K and N are transition points, and both are apex points.

The linear region V between points J and K defines a non-refractive contour, and hence is not part of either cusp.

FIG. 7A, 7B thus presents a situation similar to that of FIG. 6, differing only in the length of the non-refractive contour. Owing to the limitations in tooling discussed above, point T is really a pair of point T, T' separated by another small interfacial region W.

As is illustrated in FIG. 5B, once a transition point is identified as an apex, the direction of the apex is determined by examination of the smaller included angle θ (i.e., the angle less than 180°) extant between tangents $T_E$, and $T_{E'}$ to the contour at points E, E' each side of the apex. The bisecting line Z of that smaller included angle θ, directed toward the apex point, defines the direction of the cusp.

Figure 8A:
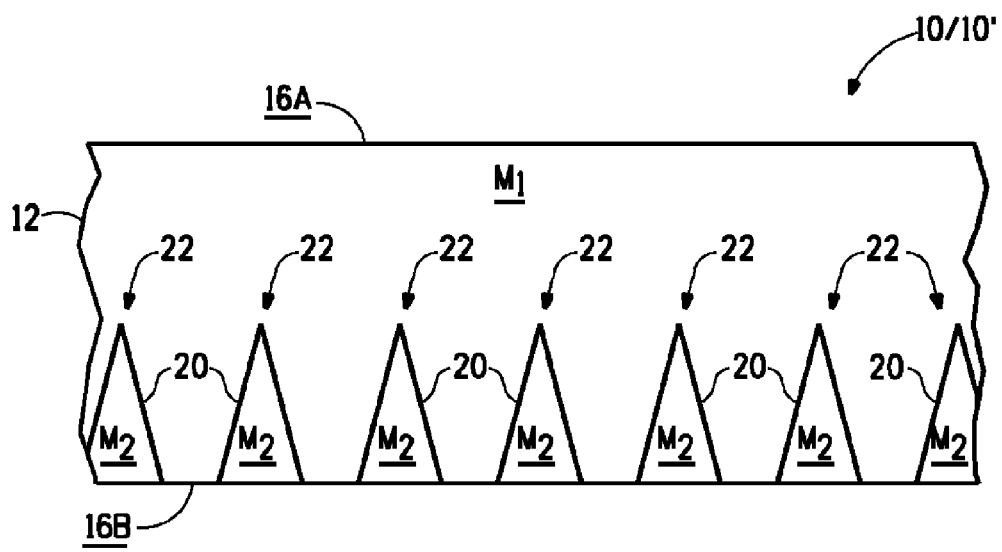
FIGS. 8A through 8C illustrate stylized pictorial representations of alternative arrangements of materials $M_1$, and $M_2$ of the optical elements, in which more than one region of a given material may be disposed within the body of the element.
Figure 8B:
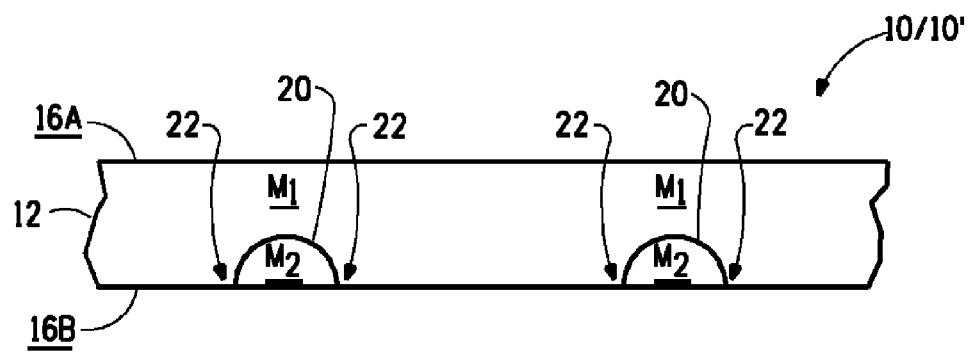
Figure 8C:
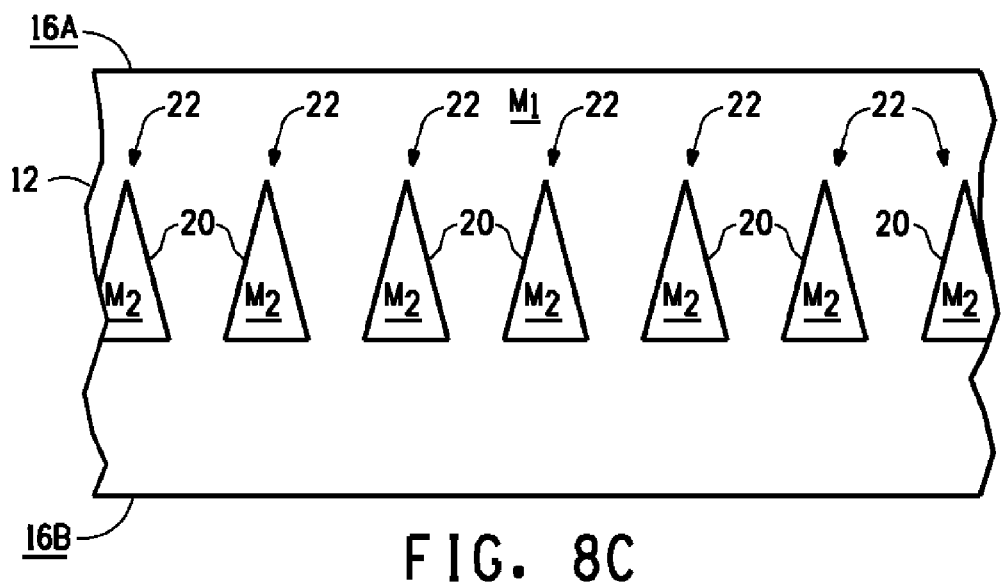

FIGS. 8A through 8C illustrate stylized pictorial representations of alternative arrangements of materials $M_1$, and $M_2$ of the optical elements. In these Figures more than one region of a given material (e.g., the material $M_2$) may be disposed within the body 12 of the element 10/10'.

-o-0-o-

When light is incident on one side of the plano-piano optical element, the light that exits the optical element on the other side will be modulated. There are four versions of this optical element, two which produces dark lines (FIGS. 2A, 4A), where the modulation leads to a region of reduced intensity on the exit side of the article, and others (FIGS. 2B, 4B), where the light exiting the optical element has a region of increased intensity. The application of this article can be to produce one modulated region in the light on the exit side, or the internal interface can be designed such that there is a periodic or aperiodic array of modulated regions of light on the exit side of the optical element.

For the photovoltaic ("PV") applications the typical modulated width and periodicities that are characteristic of concentrated photovoltaic ("CPV") applications and Flat Plate PV applications are used. For typical semiconductor cells used in high-concentrated photovoltaic ("H-CPV"), the front side conductor lines are 10 microns in width, and they are spaced on the PV cell with a periodic spacing of 100 microns. For typical crystalline silicon flat plate PV cells the front side conductor lines are typically 100 microns wide and their periodic spacing is typically 2000 microns.

The applications of this optical element are in the areas of photovoltaics, with additional applications in displays, lighting and other areas where spatial modulation of light is desirable. In the area of photovoltaics, many types of PV are used where the incident light irradiance can be 1 kW/m$^2$ typically found in flat plate PV modules of crystalline silicon, or thin film modules of silicon, CdTe, CIGS or other semiconductors. In flat plate PV modules the PV cell is typically encapsulated, such that the PV cell and the materials in contact with it, are kept in an environment with very low levels of oxygen or moisture, and this fact is important in the radiation durability of the materials used on the front side (the solar irradiated side) of the PV Cell.

In addition the area of concentrating photovoltaics (CPV) is characterized by using optical systems to concentrate solar radiation down onto small semiconductor PV cells, in which the irradiance can vary from 1 kW/m² to 10 kW/m² for low concentration, or 10 to 200 kW/m² concentrations for medium concentration PV, or 200 kW/m² to 500 kW/m² and even up to >2000 kW/m² concentrations for high concentration PV. These CPV classifications are also characterized by the need for the CPV module to mechanically track the sun during the day, so as to continue collecting light, and are referred to as L-CPV (non-tracking), M-CPV (tracking in 1 dimension) and H-CPV (tracking in 2 dimensions). In CPV modules the PV cell is not necessarily encapsulated to such a degree that the PV cell and the materials in contact with it are isolated from air, oxygen or moisture, and this environmental condition is important to consider when producing a radiation durable article for use in CPV.

Designing and fabricating the optical element involves both selecting materials with appropriate index contrast, designing the internal interface of the optical element, and fabricating the optical element. To assure that the optical element has utility during the lifetime of the PV module, requires that the selected materials are radiation durable under the solar irradiances and environmental conditions of oxygen and moisture for the application. To define the radiation durability we must know the radiation durability of the material, as represented by the induced absorbance rate at the irradiance of the application, and the desired lifetime of the PV module. The total dose of solar radiation that will be imposed on the article is given by the irradiance (in kW/m²) and the lifetime of the article. It must be noted that photochemical degradation processes, such as photochemical darkening (an increase in the optical absorbance/cm at a particular wavelength lambda) can change dramatically with changes in the solar irradiance, and also with changes in the level of oxygen or moisture present in the environment of the material.

Interface Design of the Optical Element

The conductor line optical element (CLOE) interface is designed based on the index contrast of the 2 materials chosen, and the following minimal CLOE interface defines target cusp angles, cusp depths and throw lengths for the CLOE to functional effectively. This minimal CLOE interface will be effective for the application, but it does not restrict the interface from either have larger or smaller cusp angles, depths or throw lengths. A less than minimal CLOE interface design will still have some utility. At the same time for some applications, such as in a CPV system where converging light is incident on the illuminated surface of the CLOE from a range of incident angles, one could decide to use a CLOE interface in which the s chosen is many times wider than the actual metallization lines on the PV cell, so that light incident from a range of angles will still be swepted or diverted such that they are not incident in the region of the PV cell obscured by the metallization. These considerations also apply to use of CLOEs in displays and LED lighting where the details of the illumination of the CLOE will have one design the CLEO interface as appropriate for sweeping light out of dark line regions or into bright line regions as desired for the application.

Steps for Constructing a Minimal CLOE Interface:

For the case of a dark line CLOE, if material 1 has the lower index of the pair of materials ($n_1/n_2$)<1), then refer to FIG. 12A for the geometrical parameters. If material 1 has the higher index of the pair of materials (($n_1/n_2$)>1), then refer to FIG. 12B for the geometrical parameters.

Figure 13A:
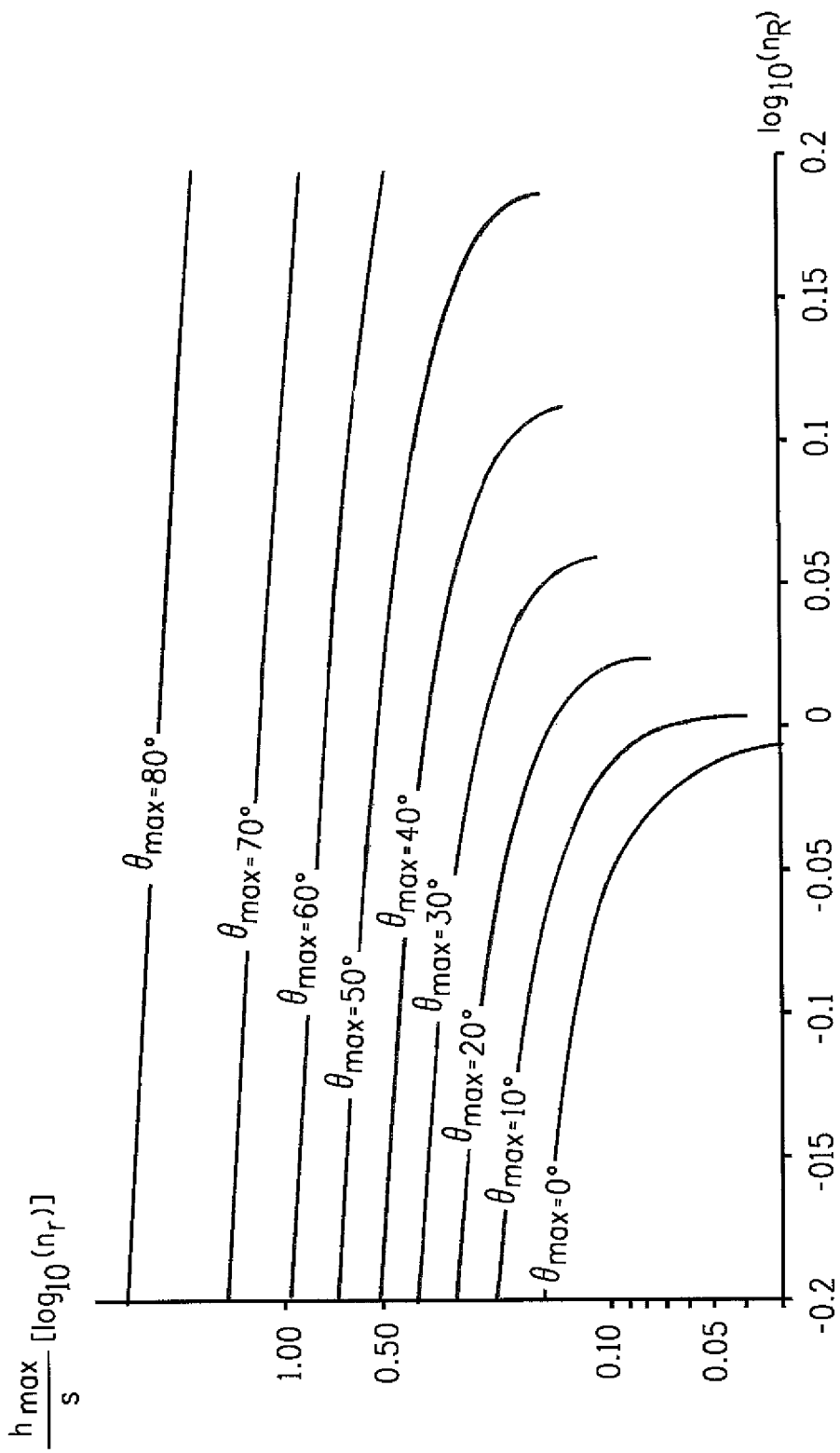
FIGS. 13A through 13C are design maps used for constructing a minimal interface for an optical element in accordance with the present invention.

1. Select a desired shadow width s.
2. Pick a point on the first design map (FIG. 13A) corresponding to a practical combination of relative refractive index $n_r = n_1/n_2$, maximum cusp height $h_{max}$ and maximum cusp angle $\theta_{max}$.
3. Draw a polar coordinate system ($\rho$, $\alpha$) with an origin located a distance $h_{max}$ below, and a distance s to the left, of the desired apex point, and where the polar angle $\alpha$ is to be measured clockwise from the vertical line passing through the origin (which will be denoted as the line-of-onset).
4. Define the maximum polar angle $\alpha_{max} = \tan^{-1}(s/h_{max})$.
5. Generate a curve $\rho_m(\alpha)$ connecting the line-of-onset and apex point by plotting the points:

$$\rho_m(\alpha) = \frac{n_r h_{max} - \sqrt{s^2 + h_{max}^2}}{n_r \cos\alpha - 1}$$

on the interval $0 \leq \alpha \leq \alpha_{max}$, which defines the refractive region. The intersection of this curve with the line-of-onset defines the onset point where the tangent slope of the curve is zero.

The resulting curve $\rho_m(\alpha)$ defines the minimal CLOE interface with the following characteristics:

The interface is a portion of a conic-section of eccentricity $n_r$; i.e., an ellipse with downward-pointing cusp for $n_r<1$ or a hyperbola with upward-pointing cusp for $n_r>1$.

All light normally-incident on the minimal interface is brought to a sharp focus at the origin.

The minimal interface represents the limiting case of all possible generic CLOE interfaces that have the same shadow width s and relative index $n_r$.

The cusp angle of the minimal interface is $\theta_{max}$, the largest possible for any generic interface.

Figure 13B:
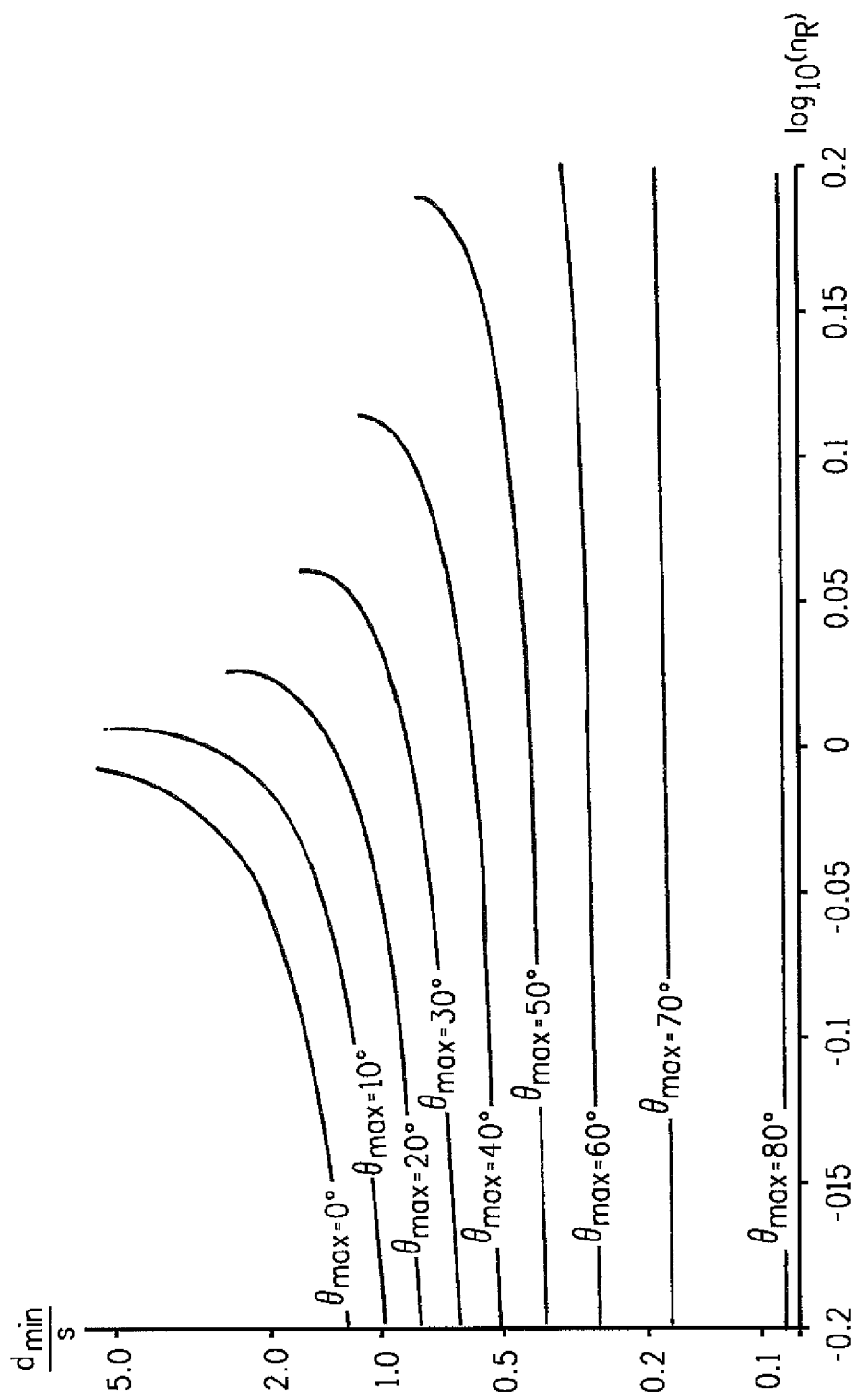

The depth of the minimal interface over the shadow zone is $d_{min} = |\rho_m(0) - h_{max}|$, which can be read-off from the second design map (FIG. 13B). This is the least depth of any generic interface.

Figure 13C:
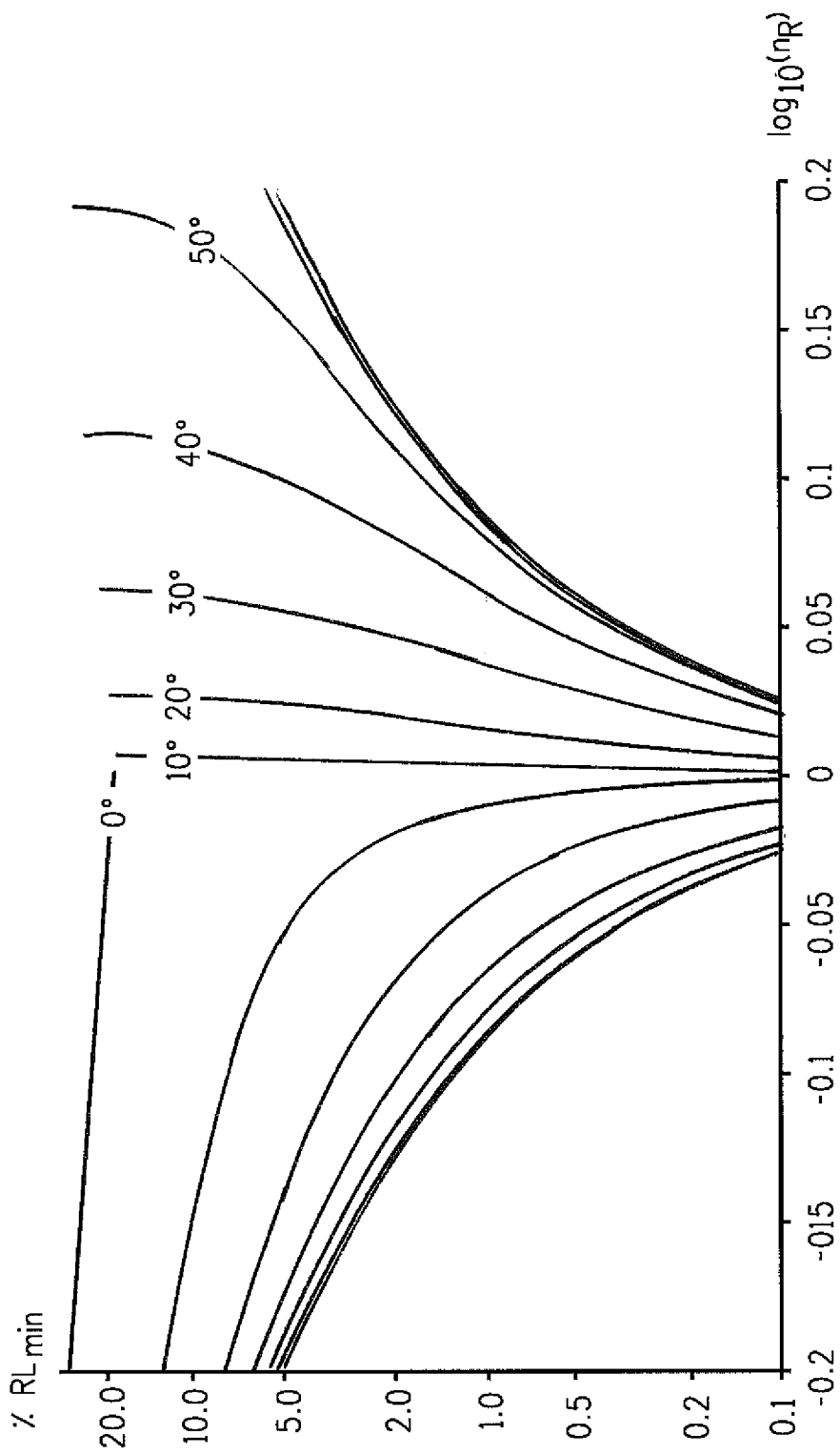

The reflection loss from the minimal interface will be $RL_{min}$ (see the third design map, FIG. 13C), the least of any generic interface.

The height $h_{max}$ of the minimal interface is the greatest of any generic interface, such that the dark line half width does not exceed s.

The steps for constructing a minimal CLOE interface for a bright line optical element should be substantially analogous.

Materials Selection for Appropriate Index Contrast

Once the necessary light modulation width and periodicity for the application are understood, the irradiance and lifetime requirements in the application, the appropriate two materials to use in designing the optical element and its internal interfacial structure can be selected. The absolute value of the index contrast, defined as $|\text{Log}_{10}(n_1/n_2)|$, wants to be large so as to produce a compact optical element, yet high contrast can increase the reflection losses from the cusped regions as possible. Yet at the same time, for the optical element to provide sufficient lifetime it is necessary to choose very radiation durable materials, which can lead to choosing a materials pair for the optical element that has lower optical contrast, since in some cases very high index materials also exhibit low radiation durability and high induced absorbance rate.

Choosing one material to be a fluorine containing polymer can be advantageous, since fluorine content is related to a decrease in the index of refraction of the material, and therefore serves to increase the index contrast of the chosen materials pair, with out requiring one material to be of a very high index.

The materials may be chosen such that they do not have very large index contrast, but instead so that they are less costly for the application, while still exhibiting sufficient lifetime at the application's irradiance level. An example of this would be using ethylene backbone polymers in flat plate PV applications at 1 kW/m² irradiance in which the module design precludes the optical element being exposed to air or moisture during its lifetime. This oxygen exposure avoidance, will reduce the degree of photo-oxidative darkening of the materials, and enables the use of less radiation durable materials than if they were used in an oxygen containing environment. Radiation durability of materials in Flat plate PV applications are reasonably well known, due to their common use.

Even in the flat plate PV applications, many materials are not radiation durable, even if they have adequate index contrast, their lifetimes would be restricted to very short period.

In accordance with the present invention, preferred materials are those that have an index contrast "c" as defined by the relationship:

$$c = \log_{10} n_R, \text{ where } n_R = (n_1/n_2)$$

wherein the absolute value of "c" lies within the range from about 0.001 to about 0.17, such that $$0.001 < |c| < 0.17.$$

More preferred are materials that have the absolute value of "c" within the range from about 0.01 to about 0.05, such that $0.01 < |c| < 0.05$.

The more preferred materials are indicated by underlined values in the Table 1 labeled "D-line Index of Refraction and Index Contrasts of materials 1 and 2. Index Contrast=Log10 (n1/n2)" that follows herein.

Materials Selection for Sufficient Lifetime in the Designed Application and Irradiance When looking at the CPV applications, where long lifetimes at 5, 50 or 500 kW/m² irradiances are desired, the total dose of solar radiation delivered to the sample can become extremely high. For example in 1 year, with AM1.5D solar radiation, a flat plate (1 kW/m²) application will have a solar radiation dose of approximately 9.3 GJ/m²/yr while at 50 Suns the total solar radiation dose would be approximately 465.0 GJ/m²/yr, and at 1500 kW/m² irradiance the total solar radiation dose would be approximately 1395 GJ/m²/yr. The radiation durability of a material may not be linear in dose, and may be strongly affected by irradiance levels and environmental factors such as oxygen or moisture. It is apparent that experimental knowledge of the radiation durability is essential in materials selection for long lifetime. Data at approximately 3.8 kW/m² and 52 kW/m² irradiance, which permits the determination of the induced absorbance rate in materials that can be selected for use in a CLOE is very important to the materials selection decisions. The important radiation durability and lifetime considerations are that the Irradiance times the desired lifetime represents the total solar radiation dose that will be imposed on the materials during their lifetime. The induced absorbance rate, which corresponds to the highest rate of the increase in the optical absorbance of the material, at some wavelength, represents photochemical darkening events in the material. This induced absorbance rate times the total dose expected over the CLOE's lifetime therefore gives one an estimate of the total induced absorbance which is added to the initial optical absorbance of the material prior to its use in solar radiation. When the total optical absorbance of the material becomes too large, the CLOE is degraded.

In accordance with the invention materials having an induced absorbance rate ΔAbs/Dose less than or equal to about 0.4 are preferred. More preferred are materials that have an induced absorbance rate ΔAbs/Dose less than or equal to 0.2. The more preferred materials are identified with underlined values in the Table 2 "Induced Absorbance Rates of Materials Tested in Air at Solar Irradiances Of Approximately 4 And 50 KW/m²" that follows herein.

It should be noted that the presence of oxygen around a material can increase its induced absorbance rate. In the mentioned Table the induced absorbance rates are for materials tested in air. Accordingly, various listed materials are inoperative when used in an air environment (>=0.4). These inoperative (in air) materials are indicated by an asterisk ("*") in the Table.

However, when these same materials are used for a flat plate PV application, due to the encapsulation, these materials would exhibit a lower induced absorbance rate. Therefore, various materials identified in the table as an inoperative in air could be operative in a flat plate PV application.

How the Optical Element is Made

The optical element can be manufactured by any of the methods known in the art. In one embodiment of the invention the optical element comprises a hard material and a soft material with different indices of refraction giving adequate contrast. The hard material can be glass or a transparent polymer with a high glass transition temperature. The soft material can be a transparent polymer with a lower glass transition temperature, or a crosslinkable elastomer, or a liquid reactive oligomer. The hard material determines the interfacial shape of the optical element. It can be fabricated by standard methods such as compression and injection molding at the appropriate temperatures. The soft material can then be molded over the hard material at temperatures that would not change the shape of the first material. In another variation of the invention the soft material is a liquid oligomer that can be poured over the hard material and cured in situ to solid. In another variation the soft material can be applied from solution using a solvent that does not interact with the first material and the solvent then evaporated. The soft material can be optionally crosslinked after the optical element is made. Typical methods known in the art for crosslinking, such as the use of thermal or photochemical initiators, can be used. In some embodiments, copolymers can be used that are photo-crosslinkable in the absence of photoinitiators. Molds for compression or injection molding can be made by methods known in the art such as mechanical diamond turning and other microstructure creation methods such as laser patterning of photosensitive materials. In most of these methods a master is created first in a softer material such as copper or a photopolymer, and then it is replicated using nickel electrodeposition techniques well known in the art.

Combinations of CLOES with Secondary Optics

Figure 10:
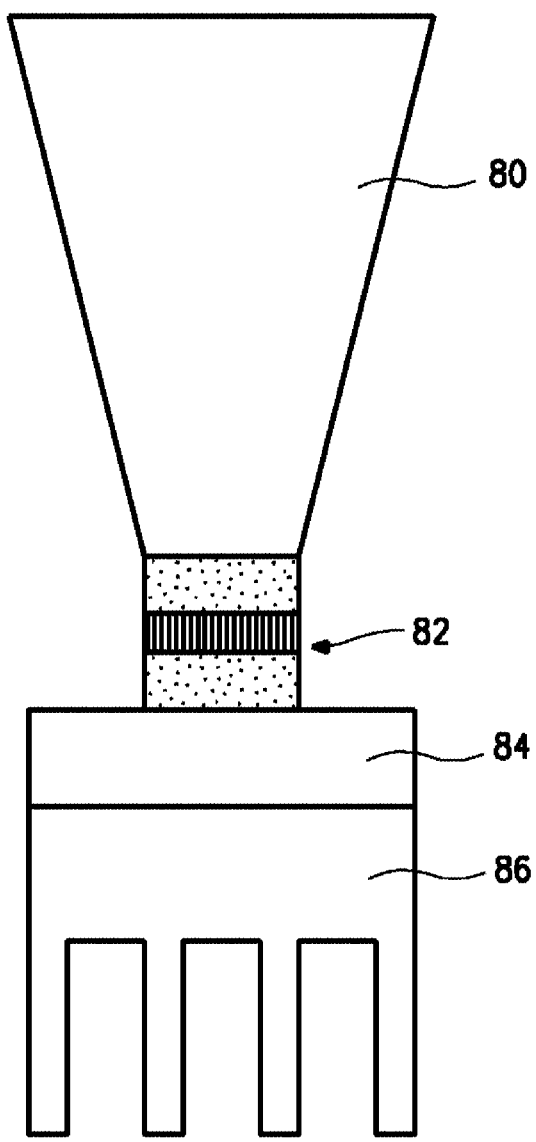
FIG. 10 is a stylized schematic representation of an integrated photovoltaic cell assembly that includes an CPV cell with secondary optics, a heat sink, and an optical element in accordance with the present invention.

CLOEs can be used in CPV systems as an optical element disposed between a secondary optic and a PV cell. Here the plano-piano nature of the CLOE is very beneficial. FIG. 10 is a stylized schematic representation of an integrated photovoltaic cell assembly that includes a secondary optic, a PV cell, and an optical element in accordance with the present invention.

The secondary optics are typically a secondary concentrator to increase the optical concentration above that achieved by the primary optical concentrator, an optical homogenizer which serves to make the optical illumination of the PV cell more uniform, or a combined secondary concentrator/homogenizer. It therefore is possible combine the CLOE with the secondary optic and make a single article that performs both the CLOE and secondary optic functions.

The CLOE can also be integrated with the PV Cell and with the PV cells submount if desired too further enable integration of these elements, and simplify the assembly of the CPV module and increase its performance and effectiveness.

Figure 9A:
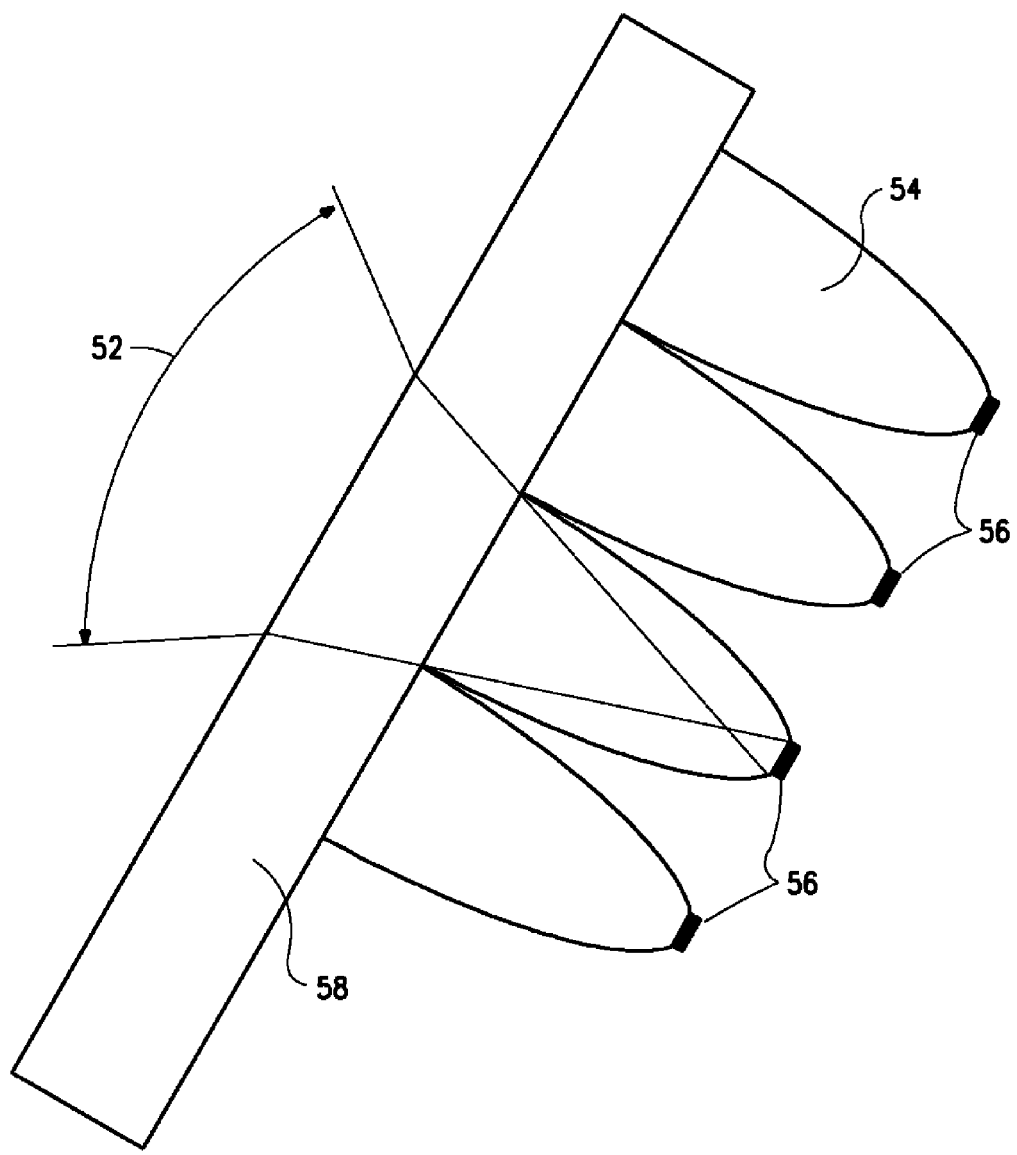
Figure 9C:
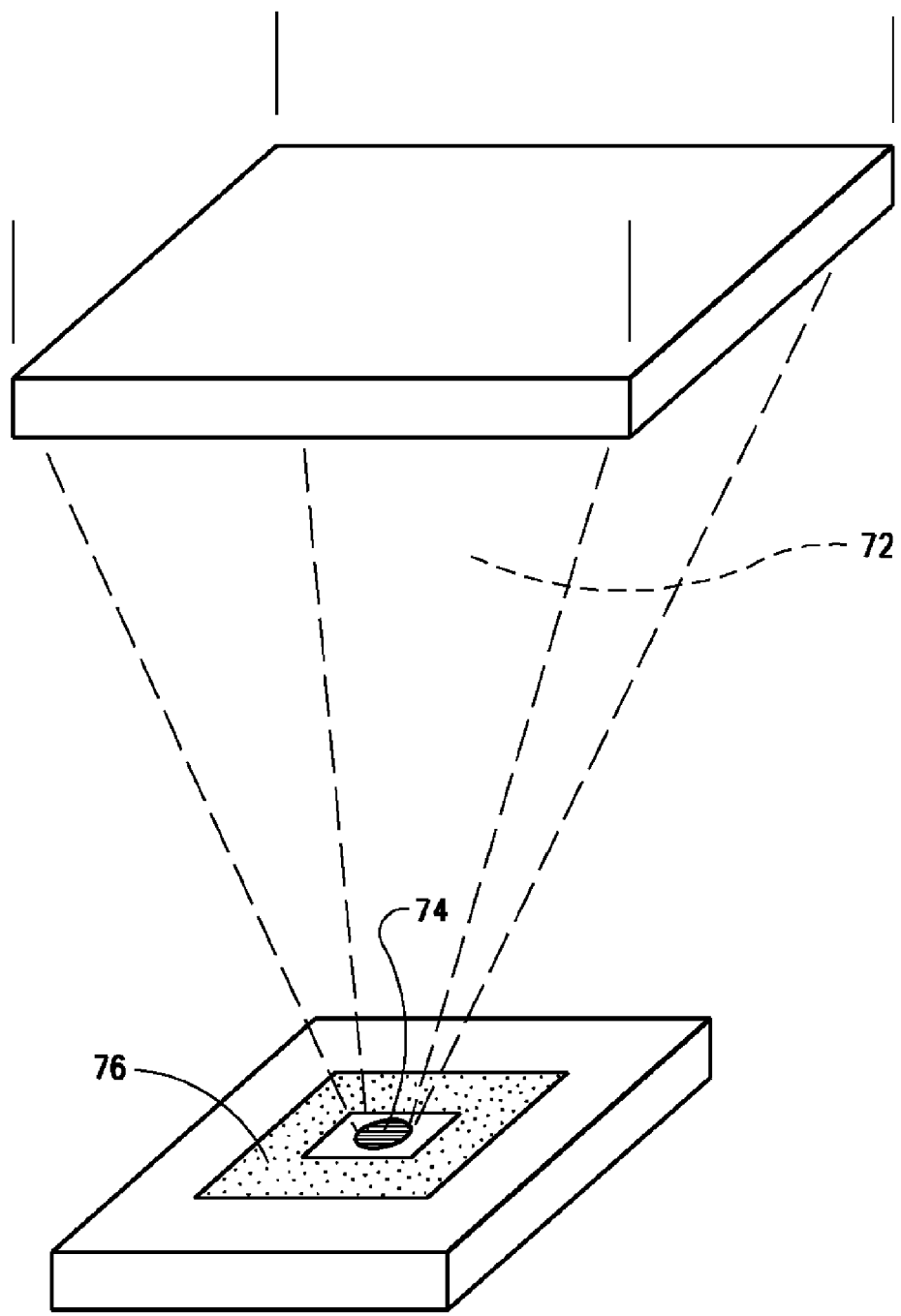

CPV Module Discussion A CPV module for low, medium or high concentration incorporates a PV cell, with its submount and heat sink, with a CLOE, any necessary secondary optics, the primary optics of the system (e.g., a linear Fresnel Lens) and any structural elements needed to position the components of the system and protect them from the environment. Stylized schematic representations of low, medium and high concentration CPV modules that include an optical element in accordance with the present invention are illustrated in FIGS. 9A through 9C, respectively.

CPV System Discussion A CPV module must be mounted such that it is oriented correctly with respect to the sun. In the case of a medium or high concentration CPV system, it is also required to have a tracker, which is a motorized system to enable the CPV module to be pointed at the sun, as the sun traverses the sky during the day. The tracker can be of a 1-axis motorized type, typical for an M-CPV system, or a 2-axis tracker typically used for a H-CPV system. In addition there are the required inverters to transform DC to AC electricity and their associated wiring and electronics, and mounts or bases to support the trackers and modules.

Figure 11:
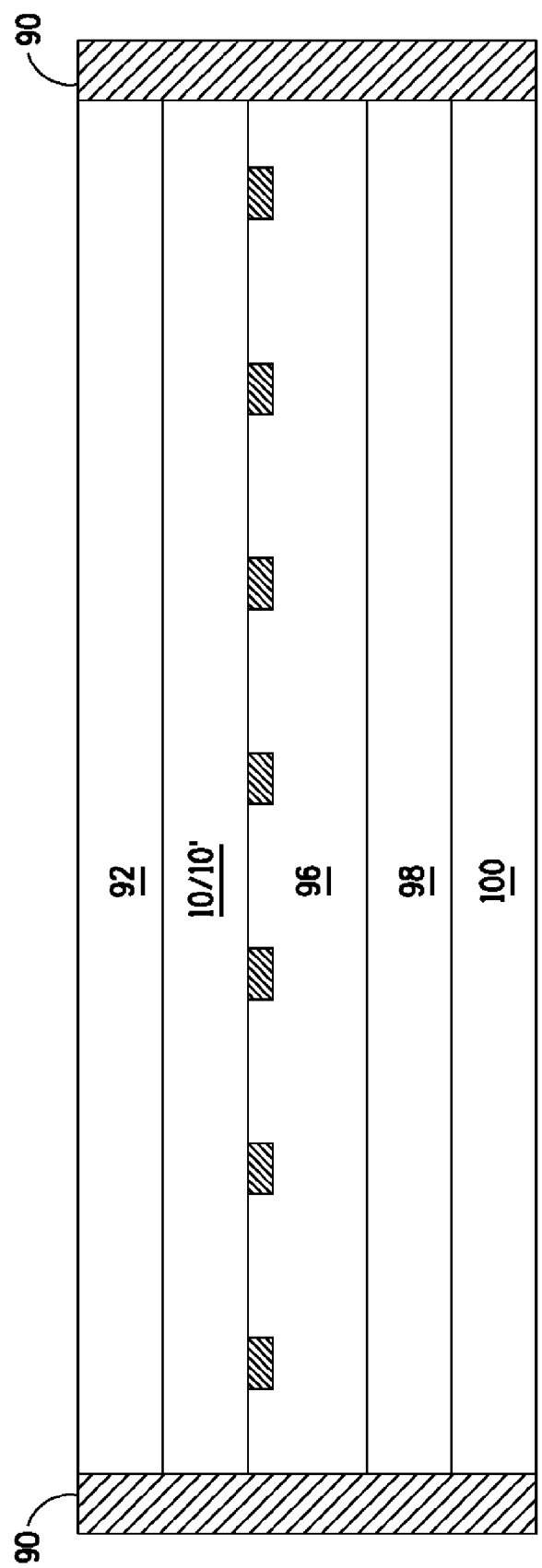
FIG. 11 is a stylized schematic representation of a flat plate PV apparatus that includes a photovoltaic cell with a front side metallization, and optical element in accordance with the present invention.

Flat Plate PV Discussion FIG. 11 is a stylized schematic representation of a flat plate PV apparatus that includes a photovoltaic cell with a front side metallization, and optical element in accordance with the present invention. The optical element 10/10' is encapsulated between a front and a back sheet.

For Flat Plate PV, such as those using crystalline (single, multi-crystalline or amorphous, or combined) silicon PV cells, or using other PV cell materials such as CdTe, or CIGS, the PV module is of a different type of construction that does not use primary and secondary optics for focusing and homogenizing the light. Instead 1 kW/m² irradiance solar radiation is incident on the PV cell. Flat Plate PV cells still in many cases use front side metallization and have the same issue of obscuration. In these Flat Plate PV modules, a CLOE can provide similar benefit by reducing the negative impact of the front side obscuration. Also in many cases, the PV cells are encapsulated to reduce any air or oxygen exposure. The low oxygen and moisture environment in the region of the PV cell in a Flat Plate system, can dramatically reduce the induced absorbance rate of optical materials of utility in CLOEs, and therefore permit longer useful lifetimes. The radiation durability results presented in the examples are of materials in air, and it is expected that in a low oxygen environment, typical of a Flat Plate PV Module, many of these materials presented would be applicable for CLOEs for Flat Plate PV cells and modules.

Displays Displays are optical devices with addressable pixel units which are spatially distributed and typically have a small region around each pixel which is dark, i. e. is a region from which light is not emitted. This is a common feature of liquid crystal displays (LCDs), in which a back light unit, using fluorescent lamps or LED, produces a uniform illumination of the back side of the LCD panel, but due to the need to physically isolate adjacent pixels, there are dark boundaries present on the side of the LCD panel opposite to the back light unit. Similar phenomena arise in other pixel based displays based on OLEDs or other light emitting displays. CLOEs, can be designed to take the spatially modulated light, exiting the pixel based display, and using an appropriately designed CLOE, one can achieve a more spatially uniform illumination on the side of the CLOE that is opposed to the LCD display and its back light unit. This will effectively remove the deleterious effect of the dark pixel boundaries on the display's image.

LED Lighting In the use of light emitting diodes (LEDs) for lighting, an important issue is that the LEDs are exceedingly bright, spatially localized sources of light that due to the small active, light producing area of the LED to some degree approximate point sources of light. In this case a CLOE can also be utilized to decrease the strong spatial modulation of the light from the LED, to produce less modulated light on the side of the CLOE which is opposite to the LED.

EXAMPLES

Index of Refraction Methods & Results

Variable angle spectroscopic ellipsometry (VASE) measurements were performed with a VUV-VASE® VU-302 manufactured by J.A. Woollam Co., Inc. which had a range from 0.69 to 8.55 eV (1800 to 145 nm), and employed $MgF_2$ polarizers and analyzers. The instrument had an $MgF_2$ autoretarder and was fully nitrogen purged to avoid absorption of VUV light by ambient oxygen and water vapor, which was important at wavelengths below 200 nm. Light from both the deuterium lamp and the xenon lamp passed through a double-chamber Czerny-Turner type monochromator to provide wavelength selection and stray-light rejection. The spot diameter of light source on the surface of the sample was 2 mm. Computer-controlled slit widths adjusted the bandwidth to insure adequate spectral resolution of optical features in the data. These included closely spaced interference oscillations, which arise in very thick films. A photomultiplier tube was utilized for signal detection in the ultraviolet. A stacked Si/InGaAs photodiode detector was used for longer wavelengths. Ellipsometric measurements were conducted using light incident at angles of 55° to 80° relative to normal on the front surface of the sample, the back of which was roughened with coarse polishing paper. The instrument measures the ellipsometric parameters Ψ and Δ, which are defined by Equation 1, $$\tan(\Psi)e^{i\Delta} = \frac{R_P}{R_S} \qquad (1)$$

where $R_P/R_S$ is the complex ratio of the p and s-polarized components of the reflected amplitudes. These parameters were analyzed using the Fresnel equations in a computer-based modeling technique to determine the optical constants. VUV-VASE® VU-302 measurements for this experiment were taken from wavelength range 145 nm to 1650 nm at multiple angles of incidence (55°-80°).

The ellipsometry data, taken from the film, was fit to determine the polymer film roughness, thickness non-uniformity, and complex refractive index. An optical model was used to describe the film optical constants over the wide spectral range. The film is modeled using initial optical constants. Then the complete model was minimized by fitting the optical constants on a point-by-point basis over the full spectral range in which the data in each single wavelength was fit separately.

TABLE 1

D-line Index of Refraction and Index Contrasts of materials 1 and 2. Index Contrast = Log10 (n1/n2).

| Index Contrast = Log10($n_1/n_2$) | Material 2 (n2) | Teflon ® AF 1601 | Example 2 | Example 1 | Teflon ® PFA | Teflon ® FEP | Dyneon ® THV 220 | Example 11 | Teflon ® ETFE |
|---|---|---|---|---|---|---|---|---|---|
| Material 1 (n1) |  | 1.303 | 1.33 | 1.34 | 1.343 | 1.350 | 1.355 | 1.380 | 1.398 |
| Teflon ® AF 1601 | 1.303 | 0.000 | −0.009 | −0.012 | −0.013 | −0.015 | −0.017 | −0.025 | −0.031 |
| Example 2 | 1.33 | 0.009 | 0.000 | −0.003 | −0.004 | −0.006 | −0.008 | −0.016 | −0.022 |
| Example 1 | 1.34 | 0.012 | 0.003 | 0.000 | −0.001 | −0.003 | −0.005 | −0.013 | −0.018 |
| Teflon ® PFA | 1.343 | 0.013 | 0.004 | 0.001 | 0.000 | −0.002 | −0.004 | −0.012 | −0.017 |
| Teflon ® FEP | 1.350 | 0.015 | 0.006 | 0.003 | 0.002 | 0.000 | −0.002 | −0.010 | −0.015 |
| Dyneon ® THV 220 | 1.355 | 0.017 | 0.008 | 0.005 | 0.004 | 0.002 | 0.000 | −0.008 | −0.014 |
| Example 11 | 1.38 | 0.025 | 0.016 | 0.013 | 0.012 | 0.010 | 0.008 | 0.000 | −0.006 |
| Teflon ® ETFE | 1.398 | 0.031 | 0.022 | 0.018 | 0.017 | 0.015 | 0.014 | 0.006 | 0.000 |
| Silicone RTV-615 | 1.406 | 0.033 | 0.024 | 0.021 | 0.020 | 0.018 | 0.016 | 0.008 | 0.002 |
| Silicone XE14-C1063 | 1.41 | 0.034 | 0.025 | 0.022 | 0.021 | 0.019 | 0.017 | 0.009 | 0.004 |
| Amorphous SiO2 | 1.46 | 0.049 | 0.041 | 0.037 | 0.036 | 0.034 | 0.032 | 0.024 | 0.019 |
| Tedlar ® PVF TR10AH9 | 1.45 | 0.046 | 0.038 | 0.034 | 0.033 | 0.031 | 0.029 | 0.021 | 0.016 |
| Tedlar ® PVF UT20BG3 | 1.45 | 0.046 | 0.038 | 0.034 | 0.033 | 0.031 | 0.029 | 0.021 | 0.016 |
| PV5200 PVB | 1.480 | 0.055 | 0.046 | 0.043 | 0.042 | 0.040 | 0.038 | 0.030 | 0.025 |
| PV5300 Ionomer | 1.487 | 0.057 | 0.048 | 0.045 | 0.044 | 0.042 | 0.040 | 0.032 | 0.027 |
| PV1400 EVA | 1.489 | 0.058 | 0.049 | 0.046 | 0.045 | 0.043 | 0.041 | 0.033 | 0.027 |
| PMMA | 1.489 | 0.058 | 0.049 | 0.046 | 0.045 | 0.043 | 0.041 | 0.033 | 0.027 |
| Acrylite ® FF | 1.49 | 0.058 | 0.049 | 0.046 | 0.045 | 0.043 | 0.041 | 0.033 | 0.028 |
| COC (Topaz) | 1.498 | 0.061 | 0.052 | 0.048 | 0.047 | 0.045 | 0.044 | 0.036 | 0.030 |
| Crystalline SiO2 | 1.543 | 0.073 | 0.065 | 0.061 | 0.060 | 0.058 | 0.056 | 0.048 | 0.043 |
| PET | 1.575 | 0.082 | 0.073 | 0.070 | 0.069 | 0.067 | 0.065 | 0.057 | 0.052 |
| PC-Lexan | 1.587 | 0.086 | 0.077 | 0.073 | 0.073 | 0.070 | 0.069 | 0.061 | 0.055 |
| PS (677) | 1.590 | 0.086 | 0.078 | 0.074 | 0.073 | 0.071 | 0.069 | 0.062 | 0.056 |
| PEN | 1.75 | 0.128 | 0.119 | 0.116 | 0.115 | 0.113 | 0.111 | 0.103 | 0.098 |

| Index Contrast = Log10(n1/n2) | Silicone RTV-615 | Silicone XE14-C1063 | Amorphous SiO2 | Tedlar ® PVF TR10AH9 | Tedlar ® PVF UT20BG3 | PV5200 PVB | PV5300 Ionomer | PV1400 EVA |
|---|---|---|---|---|---|---|---|---|
| Material 1 (n1) | 1.406 | 1.41 | 1.46 | 1.45 | 1.45 | 1.480 | 1.487 | 1.489 |
| Teflon ® AF 1601 | −0.033 | −0.034 | −0.049 | −0.046 | −0.046 | −0.055 | −0.057 | −0.058 |
| Example 2 | −0.024 | −0.025 | −0.041 | −0.038 | −0.038 | −0.046 | −0.048 | −0.049 |
| Example 1 | −0.021 | −0.022 | −0.037 | −0.034 | −0.034 | −0.043 | −0.045 | −0.046 |
| Teflon ® PFA | −0.020 | −0.021 | −0.036 | −0.033 | −0.033 | −0.042 | −0.044 | −0.045 |
| Teflon ® FEP | −0.018 | −0.019 | −0.034 | −0.031 | −0.031 | −0.040 | −0.042 | −0.043 |
| Dyneon ® THV 220 | −0.016 | −0.017 | −0.032 | −0.029 | −0.029 | −0.038 | −0.040 | −0.041 |
| Example 11 | −0.008 | −0.009 | −0.024 | −0.021 | −0.021 | −0.030 | −0.032 | −0.033 |
| Teflon ® ETFE | −0.002 | −0.004 | −0.019 | −0.016 | −0.016 | −0.025 | −0.027 | −0.027 |
| Silicone RTV-615 | 0.000 | −0.001 | −0.016 | −0.013 | −0.013 | −0.022 | −0.024 | −0.025 |
| Silicone XE14-C1063 | 0.001 | 0.000 | −0.015 | −0.012 | −0.012 | −0.021 | −0.023 | −0.024 |
| Amorphous SiO2 | 0.016 | 0.015 | 0.000 | 0.003 | 0.003 | −0.006 | −0.008 | −0.009 |
| Tedlar ® PVF TR10AH9 | 0.013 | 0.012 | 0.003 | 0.000 | 0.000 | −0.009 | −0.011 | −0.012 |
| Tedlar ® PVF UT20BG3 | 0.013 | 0.012 | 0.003 | 0.000 | 0.000 | −0.009 | −0.011 | −0.012 |
| PV5200 PVB | 0.022 | 0.021 | 0.006 | 0.009 | 0.009 | 0.000 | −0.002 | −0.003 |
| PV5300 Ionomer | 0.024 | 0.023 | 0.008 | 0.011 | 0.011 | 0.002 | 0.000 | −0.001 |
| PV1400 EVA | 0.025 | 0.024 | 0.009 | 0.012 | 0.012 | 0.003 | 0.001 | 0.000 |
| PMMA | 0.025 | 0.024 | 0.009 | 0.012 | 0.012 | 0.003 | 0.001 | 0.000 |
| Acrylite ® FF | 0.025 | 0.024 | 0.009 | 0.012 | 0.012 | 0.003 | 0.001 | 0.000 |
| COC (Topaz) | 0.028 | 0.026 | 0.011 | 0.014 | 0.014 | 0.005 | 0.003 | 0.003 |
| Crystalline SiO2 | 0.049 | 0.048 | 0.033 | 0.036 | 0.036 | 0.027 | 0.025 | 0.024 |
| PET | 0.053 | 0.051 | 0.036 | 0.039 | 0.039 | 0.030 | 0.028 | 0.028 |
| PC-Lexan | 0.053 | 0.052 | 0.037 | 0.040 | 0.040 | 0.031 | 0.029 | 0.029 |
| PS (677) | 0.095 | 0.094 | 0.079 | 0.082 | 0.082 | 0.073 | 0.071 | 0.070 |

| Index Contrast = Log10(n1/n2) | PMMA | Acrylite ® FF | COC (Topaz) | Crystalline SiO2 | PET | PC-Lexan | PS (677) | PEN |
|---|---|---|---|---|---|---|---|---|
| Material 1 (n1) | 1.489 | 1.49 | 1.498 | 1.543 | 1.575 | 1.587 | 1.590 | 1.75 |
| Teflon ® AF 1601 | −0.058 | −0.058 | −0.061 | −0.073 | −0.082 | −0.086 | −0.086 | −0.128 |
| Example 2 | −0.049 | −0.049 | −0.052 | −0.065 | −0.073 | −0.077 | −0.078 | −0.119 |
| Example 1 | −0.046 | −0.046 | −0.048 | −0.061 | −0.070 | −0.073 | −0.074 | −0.116 |
| Teflon ® PFA | −0.045 | −0.045 | −0.047 | −0.060 | −0.069 | −0.073 | −0.073 | −0.115 |
| Teflon ® FEP | −0.043 | −0.043 | −0.045 | −0.058 | −0.067 | −0.070 | −0.071 | −0.113 |
| Dyneon ® THV 220 | −0.041 | −0.041 | −0.044 | −0.056 | −0.065 | −0.069 | −0.069 | −0.111 |
| Example 11 | −0.033 | −0.033 | −0.036 | −0.048 | −0.057 | −0.061 | −0.062 | −0.103 |
| Teflon ® ETFE | −0.027 | −0.028 | −0.030 | −0.043 | −0.052 | −0.055 | −0.056 | −0.098 |
| Silicone RTV-615 | −0.025 | −0.025 | −0.028 | −0.040 | −0.049 | −0.053 | −0.053 | −0.095 |

TABLE 1-continued

D-line Index of Refraction and Index Contrasts of materials 1 and 2. Index Contrast = Log10 (n1/n2).

| | | | | | | | | |
|---|---|---|---|---|---|---|---|---|
| Silicone XE14-C1063 | −0.024 | −0.024 | −0.026 | −0.039 | −0.048 | −0.051 | −0.052 | −0.094 |
| Amorphous SiO2 | −0.009 | −0.009 | −0.011 | −0.024 | −0.033 | −0.036 | −0.037 | −0.079 |
| Tedlar ® PVF TR10AH9 | −0.012 | −0.012 | −0.014 | −0.027 | −0.036 | −0.039 | −0.040 | −0.082 |
| Tedlar ® PVF UT20BG3 | −0.012 | −0.012 | −0.014 | −0.027 | −0.036 | −0.039 | −0.040 | −0.082 |
| PV5200 PVB | −0.003 | −0.003 | −0.005 | −0.018 | −0.027 | −0.030 | −0.031 | −0.073 |
| PV5300 Ionomer | −0.001 | −0.001 | −0.003 | −0.016 | −0.025 | −0.028 | −0.029 | −0.071 |
| PV1400 EVA | 0.000 | 0.000 | −0.003 | −0.015 | −0.024 | −0.028 | −0.029 | −0.070 |
| PMMA | 0.000 | 0.000 | −0.003 | −0.015 | −0.024 | −0.028 | −0.029 | −0.070 |
| Acrylite ® FF | 0.000 | 0.000 | −0.002 | −0.015 | −0.024 | −0.027 | −0.028 | −0.070 |
| COC (Topaz) | 0.003 | 0.002 | 0.000 | −0.013 | −0.022 | −0.025 | −0.026 | −0.068 |
| Crystalline SiO2 | 0.015 | 0.015 | 0.013 | 0.000 | −0.009 | −0.012 | −0.013 | −0.055 |
| PET | 0.024 | 0.024 | 0.022 | 0.009 | 0.000 | −0.003 | −0.004 | −0.046 |
| PC-Lexan | 0.028 | 0.027 | 0.025 | 0.012 | 0.003 | 0.000 | −0.001 | −0.042 |
| PS (677) | 0.029 | 0.028 | 0.026 | 0.013 | 0.004 | 0.001 | 0.000 | −0.042 |
| PEN | 0.070 | 0.070 | 0.068 | 0.055 | 0.046 | 0.042 | 0.042 | 0.000 |

Radiation Durability Methods & Results

Solar Radiation Exposure Method

The following describes the solar simulated irradiation durability set up and procedures used to expose materials to simulated solar light to enable the evaluation of the effect of full spectrum simulated solar radiation on materials.

To simulate solar radiation exposure of samples used were a Newport Corporation, (Corporate Headquarters, 1791 Deere Avenue, Irvine Calif. 92606), Solar Simulator, (Model #92190-100), with a Newport Power Supply, (Model #69922), that sends a programmed power output to a Newport Digital Exposure Control unit, (Model #68945), that was coupled with a fiber optic feed back sensor, located at the beam exit, to digitally control the light flux. This permitted the solar simulator to operate in a programmed control range that delivered a constant irradiance to the samples over the duration of the test.

The Newport Solar Simulator used a 1600 watt Xenon lamp in combination with integrated internal optics, including AM 0 and AM1.5 optical filters, to deliver a diverging beam of simulated solar spectral irradiance to the sample area. To measure the power output, at the sample level a Newport Power Meter, (Model#1918-C), connected to a Newport thermopile detector, (Model#818-250-25), located in the optical beam path, was used.

Radiation durability testing was done at uniform irradiance of approximately 3.8 KW/m². This was at a working distance of 8.3 cm from the exit window of the simulator in an exposure area of 15×15 cm. This working area allowed for the simultaneous testing of multiple samples. Typical sample size was 2.5×4 cm; sample thickness varied from 0.025 to 2.5 mm. The total exposure dose in GJ/m² was calculated from the irradiance in kW/m² times the exposure time. The beam irradiance was measured using a Newport 25 watt thermopile type detector, (Model #(818-25-12),). During irradiation exposures, temperature and relative humidity were not controlled, they are typical of an air conditioned laboratory. Sample temperature rose from room temperature to typically 50° C. as samples were exposed to the simulated solar light.

Radiation Durability was also done at uniform irradiances of 48 kW/m² by adding a Newport 13× concentrator lens assembly, (Model #SP81030-DIV) to the exit window of the Newport Solar Simulator. The assembly mounted onto the diverging solar simulator producing a 2.5×2.5 cm working area at a distance of 8.5 cm from the final condensing lens which enabled testing samples up to 2.5×0.5 cm in size. This beam irradiance was measured by using a Newport 250 watt fan cooled thermopile type detector,(Model #818-250-25), with a 0.6×0.6 cm aperture plate attached. Also, during irradiation, temperature and relative humidity are not controlled but are typical of an air conditioned laboratory. Sample temperature rises from room temperature to typically 50° C. as samples are exposed to the simulated solar light.

Center Mount Absorbance Method

The optical absorbance of free standing films and films on high purity fused silica substrates was determined by the center mount absorbance method over the entire 200-2500 nm wavelength range using a Varian Cary 5000 UV-Vis-NIR spectrophotometer with an accessory integrating sphere (Varian DRA-2500). A clip-style variable angle center mount sample holder is used for the absorbance measurement for films and film on glass translucent samples. The measured value of absorbance was divided by the film thickness to obtain a value of optical absorbance per cm (base 10).

$$A/\text{cm} = (-\log T_{film})/t \quad (2)$$

$$A/\text{cm} = \frac{\log_{10}[T_{substrate}/T_{film}]}{t_{film}} \quad (3)$$

Where A is the base 10 optical absorbance per cm, T is the transmission of film, and t is the thickness of film (cm). The calculation of optical absorbance assumed that the free standing film was of homogenous composition and uniform thickness. For film on glass samples, the calculation of optical absorbance assumed that the transmission (T) of the glass substrate is 1. Transmission based measurements also required that the film thickness of the sample on the substrate be optimized for the dynamic range of the technique so that the transmittance of the film falls in the range from 3 to 90%. If the transmittance falls much below 1%, the accuracy of the measurement was severely degraded, and erroneous results appear.

The center mount measurement was conducted under the following conditions: The external DRA-2500 was installed into the spectrophotometer and aligned. UV-Vis-NIR spectra were, in general, acquired in the region of 200-2500 nm using appropriate baseline correction (zero/baseline for % T and absorbance correction for spectral only). Indicative instrumental parameters were as follows: spectral bandwidth (SBW): 4 nm (UV/Vis), 16 nm (NIR); averaging time: 0.4 sec; data interval: 2 nm; double beam mode using full slit height for % T and absorbance, a small spot kit (SSK) was used for the center mount absorbance data.

As in all experimental measurements, the accuracy of the measured values was a function of the sample and measurement apparatus. The inherent sensitivity of spectral transmission and absorbance measurements is affected by the optical path length of the sample, and the transmission drop that occurs as light transmits through the sample. As the transmission decreased, the accuracy of absorbance measurement decreased. A transmission difference of ~0.1% is near the limit of the measurement method.

Induced Absorbance Rate: Average $\Delta$Abs/cm per GJ/m$^2$ Dose Calculation

The induced absorbance rate, or Average $\Delta$Abs/cm per GJ/m$^2$ Dose, was calculated by $$\text{Average } \frac{\text{ABS}}{\text{cm}} \text{ per } \frac{\text{GJ}}{\text{m}^2} \text{ Dose} = \frac{\frac{\text{Abs}_f(\lambda)}{\text{cm}} - \frac{\text{Abs}_i(\lambda)}{\text{cm}}}{\text{Dose}_{\text{total}}} \quad \text{Equation (4)}$$

cal bleaching and darkening of both intrinsic and extrinsic components of the material and is scaled in units of 1 GJ/m$^2$ dose.

Combining insights derived from the Induced Absorbance Rate, with experiments run at different irradiance levels (such as 3.8 kW/m$^2$ and 48.2 kW/m$^2$), will help to define the best material sets and understand the mechanisms which are related to the lifetime improvement.

The Average $\Delta$Abs/cm per GJ/m$^2$ Dose was measured as a function of wavelength and in the table report the value of this induced absorbance rate for a particular wavelength where it is the largest positive value observed at a particular irradiance. Positive values of the induced absorbance rate correspond to Photodarkening, i.e. increasing optical absorbance, whereas negative values of the induced absorbance rate correspond to Photobleaching. The induced absorbance rate was used as indicative of solar radiation induced photodegradation of the material, which limits the useful lifetime of the material in the optical element due to the continuing increase in the material's optical absorbance.

TABLE 2

Induced Absorbance Rates of Materials Tested in Air at Solar Irradiances Of Approximately 4 And 50 KW/m$^2$

| Material | 4 Sun Irradiance (kW/m$^2$) | 4 Sun Total Dose (GJ/m$^2$) | 4 Sun $\Delta$Abs/Dose (Abs/cm/(GJ/m2)) | 4 Sun At $\lambda$ (nm) | 50 Sun Irradiance (kW/m$^2$) | 50 Sun Total Dose (GJ/m$^2$) | 50 Sun $\Delta$Abs/Dose (Abs/cm/(GJ/m2)) | 50 Sun At $\lambda$ (nm) |
|---|---|---|---|---|---|---|---|---|
| Teflon PFA (5 mil) | | | — | | 52.0 | 158.0 | 0.008 | 222 |
| Teflon ® FEP 200A | 3.8 | 42.4 | 0 | | | | — | |
| Teflon ® FEP 500A | 3.8 | 42.4 | 0 | | 52.0 | 158.0 | 0.014 | 222 |
| Teflon ® ETFE 200LZ | 3.8 | 42.4 | 0 | | | | — | |
| Teflon ® ETFE 500LZ | 3.8 | 42.4 | 0 | | 52.0 | 158.0 | 0 | |
| Example 2 | 3.8 | 37.4 | 0.076 | 304 | 52.0 | 158.0 | 0.021 | 308 |
| Example 1 | 3.8 | 37.4 | 0 | | 52.0 | 158.0 | 0.175 | 234 |
| Example 11 | 3.8 | 37.4 | 0 | | 52.0 | 158.0 | 0 | |
| Tedlar ® TUT20BG3 | 3.8 | 37.4 | 0 | | | | — | |
| Tedlar ® TR10AH9 | 3.7 | 27.4 | 0 | | 51.7 | 79.8 | 0.013 | 312 |
| Silicone XE14-C1063 | 3.8 | 37.4 | 0.033 | 237 | 52.0 | 78.2 | 0.055 | 230 |
| Melinex XST 6578 | 3.7 | 27.4 | 0.085 | 396 | | | — | |
| RTV615 Silicone | 3.8 | 37.4 | 0.172 | 220 | 52.0 | 158.0 | 0.021 | 228 |
| DuPont ™ PV 5200 (PVB)* | 3.9 | 29.8 | 0.474 | 266 | | | — | |
| Korad ® Film 05005* | 3.8 | 37.4 | 0.491 | 244 | | | — | |
| DuPont ™ Elvax ® PV1400* | 3.8 | 32.4 | 0.807 | 242 | | | — | |
| DuPont ™ PV 5300* | 3.8 | 26.9 | 1.098 | 266 | | | — | |
| Melinex ® ST504* | 3.7 | 27.4 | 1.72 | 332 | | | — | |
| Mylar ® 200DM* | 4.1 | 10.0 | 6.78 | 328 | 52.0 | 34.1 | 6.39 | 336 |

*Inoperative for use in an oxygen containing environment

Where Abs$_f$ is the finial spectral optical absorbance, Abs$_i$ is the initial spectral optical absorbance and Dose$_{total}$ is the total dose of the sample received.

It is important to develop a useful metric of photochemical processes such as photobleaching or photodarkening in testing CPV materials. One desirable radiation durability metric is the change in the spectral optical absorbance ($\Delta$Abs/cm ($\lambda$)) for an average of full spectrum solar radiation dose (in GJ/m$^2$) since this allows us to observe and study the sources of photochemical changes which arise over the exposure time. This is called the average $\Delta$Abs/cm per GJ/m$^2$ dose (or induced absorbance rate), and this metric allows tracking of the rates of photochemical processes including photochemi- Classes of Materials and Obtaining These Commercial Materials Suitable hard materials for forming the optical elements include crystalline SiO$_2$ and various glasses, for example soda-lime glass, borosilicate glass and flint glass. Suitable glasses are commonly commercially available.

Suitable hard materials also include transparent polymers and copolymers with a glass transition temperature above 100° C. and a transparency greater than 90%, for example, polymethyl methacrylate, polycarbonate, and cyclic olefin copolymers. Such transparent polymers and copolymers are commonly commercially available.

Suitable soft material for forming the optical elements includes transparent polymers and copolymers with a glass transition temperature below 100° C. and a transparency greater than 90%. Suitable soft polymers and copolymers include polydimethylsiloxane, butyl acrylate copolymers, and ethylene copolymers with vinyl acetate or (meth)acrylic acid.

Suitable soft materials also include crosslinkable elastomers such as polybutadiene, transparent FKM and FFKM fluoroelastomers, and silicone rubbers. These elastomers can be crosslinked by heating or through the use of photoinitiators such as benzyl dimethyl ketal, benzophenone or triphenyl phosphine oxide, using techniques that are known in the art.

Suitable soft materials also include liquid reactive oligomers such as polyethyleneglycol diacrylate, ethoxylated and propoxylated tri methylolpropane triacrylates, and ethoxylated pentaerythritol tetraacrylate. These oligomers can be crosslinked by free radical initiators such as organic peroxides and photoinitiators using techniques well known in the art.

In some embodiments, the soft material is a copolymer comprising at least one monomer selected from the group consisting of EVE, 8-SAVE and 8-CNVE and at least one monomer selected from the group consisting of E, TFE, VF2, PDD, PPVE, PMVE, PEVE, and EVEOCN. These copolymers are typically tacky as prepared and soluble in some solvents, but become harder and less soluble upon exposure to UV radiation, even in the absence of a photoinitiator. Longer exposure times and/or higher intensity UV radiation result in more cross-linking and more pronounced changes in the copolymer properties. Examples of the preparation and photocrosslinking of representative copolymers are given below:

Synthesis of Non-Commercial Materials

EXAMPLE 1

Preparation and Photocrosslinking of Poly(EVE/TFE)

A 1 liter autoclave was loaded with 200 ml of EVE, heated to 30° C. with stirring, pressured with 100 psi $N_2$, and vented three times. The autoclave was then pressured to 30 psi with TFE and vented, four times. The autoclave was pressured to 50 psi with TFE. Using a chilled line, 0.2 ml of ~0.2 M DP in Vertrel XF was injected. After stirring for 1 hr at ambient temperature, additional 0.2 M DP was injected at a rate of ~0.01 ml/min until 15 g of TFE had been adsorbed, while holding TFE pressure constant at 50 psi. A total of 6.72 ml of DP was injected over 623 min. The product mixture was recovered as a hazy fluid, with the consistency of motor oil. Excess EVE was distilled off under vacuum, eventually bringing the heating mantle 157° C. while pulling a vacuum of ~520 mm. This gave 40.2 g of slightly tacky gum. The gum had a Tg of −30° C. (DSC, 10° C./min, $N_2$, second heat). NMR analysis found the polymer to be 34.4 mole % EVE and 65.6 mole % tetrafluoroethylene. A 0.1 g sample of residue readily dissolved in 1 g of hexafluoroethylene, making a clear solution with a few undissolved particulates. Inherent viscosity in hexafluorobenzene was 0.07 dL/g.

After 68 hr of exposure 1 "under a Rayonet Photochemical Reactor bulb, a sample of poly(EVE/TFE) turned from a soft gum to a brittle film. Rolling a 0.0335 g piece of film with 0.5 g of hexafluorobenzene for 3 hr caused the film to gain 11% in weight. A curled piece of film maintained its shape for 2 hr in a 225° C. oven, a major change from the soft, gummy starting polymer prior to UV exposure. Exposure for 60 min at 11.5 millwatts/$cm^2$ UV intensity made a sample of poly(EVE/ TFE) smooth to the touch. The polymer sprang back when indented with a fingernail and formed a gel when mixed with hexafluorobenzene.

The index of refraction at D-line was 1.34 and the induced absorbance rate was less than or equal to 0 Abs/cm/($GJ/m^2$)) at 3.8 $kW/m^2$ and was 0.175 at a wavelength of 234 nm at an irradiance of 52 $kW/m^2$.

EXAMPLE 2

Preparation and Photocrosslinking of Poly(TFE/PMVE/PEVE/8-SAVE)

A 1 liter autoclave was charged with 450 ml of distilled water, 0.8 g of ammonium persulfate, 3 g of $C_8F_{17}COONH_4$, and 20 g of $CF_2=CFOCF_2CF(CF_3)OCF_2CF_2SO_2N_3$ (8-SAVE). The autoclave was sealed, evacuated and further loaded with 36 g of $CF_2=CFOCF_2CF_3$ (PEVE), 83 g $CF_2=CFOCF_3$ (PMVE), and 45 g of $CF_2=CF_2$ (TFE). The autoclave was heated slowly to 70° C., and then stirred for 8 hr at 70° C., while maintaining pressure from about 230-250 psi by the periodic addition of TFE:PMVE:PEVE in a roughly 1 g to 0.4 g to 0.25 g ratio. This gave an opalescent blue emulsion, with a small mass of precipitated polymer on top. The precipitated polymer was removed by filtering through cheesecloth packed in the neck of a filter funnel, giving 742 g of filtrate.

About 670 g of this filtrate were frozen and thawed. The resulting damp mass was broken into two batches, with each batch being washed in a Waring lo blender twice with 1000 ml of water, twice with 600 ml of methanol, and twice with 750 ml of acetone. Sucking the washed product dry in a Buchner filter gave springy, elastic cakes, 166 g from the first batch and 112 grams from the second batch.

The polymer analysed for 66.6 mole % TFE, 22.8 mole % PMVE, 9.2 mole % PEVE, and 1.4 mole % 8-SAVE by $^{19}F$ NMR. The polymer had a Tg of 6.5° C. (DSC, 10° C./min, $N_2$, second heat).

Rolling a 0.1 g sample of poly(TFE/PMVE/PEVE/8-SAVE) with 3 ml of Novec HFE-7500 gave a hazy solution, which was spotted on a glass microscope slide and air-dried to a colorless film. The microscope slide, while in a quartz box under $N_2$, was irradiated for 17 hr with a Rayonet Photochemical Reactor bulb. The irradiated poly(TFE/PMVE/PEVE/8-SAVE) did not redissolve in Novec HFE-7500.

The index of refraction at D-line was 1.33 and the induced absorbance rate was 0.076 Abs/cm/($GJ/m^2$)) at 3.8 $kW/m^2$ and was 0.021 at a wavelength of 308 nm at an irradiance of 52 $kW/m^2$.

EXAMPLE 3

Preparation and Photocrosslinking of Poly(EVE/E)

A 210 ml autoclave was chilled to about −20° C. and 42 ml of EVE and 10 ml of ~0.19 M DP initiator in Vertrel XF were added. The autoclave was evacuated and 3 g of ethylene were added. While shaking overnight, the pressure inside the autoclave reached a maximum of 84 psi at 20° C. after 45 min and decreased to 18 psi at 26.5° C. at the end of the run 921 min later. The resulting hazy fluid was transferred to a Teflon®-lined tray and allowed to evaporate first at ambient and then overnight in a 75° C. oven, at which point the clear, tacky residue weighed 22.4 g. The residue still weighed 22.4 g after another 24 hr in the 75° C. oven. The gum had a Tg of −36° C. (DSC, 10° C./min, $N_2$, second heat). Combustion analysis found 29.92% C and 1.64% H, versus 29.70% C and 1.65% H calculated for a polymer that is 47.6 mole % EVE and 52.4 mole % ethylene. A 0.1 g sample of residue readily dissolved in 1 ml of 2-heptanone, making a clear solution.

Exposure of a sample of poly(EVE/E) to 0.2 milliwatts/cm$^2$ UV intensity transformed it from a tacky glue-like material that was readily soluble in 2-heptanone to a non-tacky, modestly elastomeric polymer that swelled but did not dissolve in 2-heptanone. Exposure for 60 min at 11.5 milliwatts/cm$^2$ UV intensity made the polymer silky smooth to the touch. The polymer sprang back when indented with a fingernail and formed a gel when mixed with 2-heptanone.

EXAMPLE 4

Preparation and Photocrosslinking of Poly(EVE/VF2)

A 240 ml autoclave was chilled to about −20° C., and 42.2 ml of EVE dissolved in 20 ml of Vertrel XF and 25 ml of ~0.05 M DP initiator in Vertrel XF were added. The autoclave was evacuated and 13 g of vinylidene fluoride was added. Shaking overnight, the pressure inside the autoclave reached a maximum of 103 psi at 24° C. after 70 min and decreased to 5 psi at 25.4° C. at the end of the run 1090 min later. This gave a viscous, clear, water-white solution. Drying a 0.9637 g sample of this solution, first under a flow of nitrogen, and then overnight in a 75° C. oven gave 0.6703 g of tacky gum.

After exposure for 60 min at 11.5 milliwatts/cm$^2$ UV intensity, a sample of poly(EVE/VF2) had no tack, sprang back when indented with a fingernail, and formed a gel when mixed with 2-heptanone.

EXAMPLE 5

Preparation and Photocrosslinking of Poly(EVE/TFE/PDD)

A 210 ml autoclave was chilled to about −20° C., and 4 g of EVE dissolved in 50 ml of Vertrel XF, 14.2 ml of PDD, and 10 ml of ~0.17 M DP initiator in Vertrel XF were added. The autoclave was evacuated and 10 g of tetrafluoroethylene was added. Shaking overnight, the pressure inside the autoclave reached a maximum of 57 psi at 33.6° C. after 66 min, and decreased to 17 psi at 33.3° C. at the end of the run 990 min later. This gave a highly viscous solution that barely flowed. Drying under a N$_2$ flow for 43 hr under pump vacuum, and for 24 hr in a 75-52° C. vacuum oven, gave 32.55 g of polymer that had an inherent viscosity of 0.370 dL/g in hexafluorobenzene. Composition by fluorine NMR was 1.2 mole % EVE, 53.7 mole % TFE, and 45.1 mole % PDD.

After exposure under a 1 kW deep UV short arc lithographic lamp for 60 min, a sample of poly(EVE/TFE/PDD) was found to have no tack, to be still stiffer, and to form a gel that retained the shape of the starting film when mixed with Fluorinert FC-40.

EXAMPLE 6

Preparation and Photocrosslinking of Poly(EVE/PDD)

A small sample vial equipped with serum cap and magnetic stir bar was loaded with 1 ml of PDD and 2 ml of EVE. The vial was flushed with N$_2$, and 1 ml of ~0.17M DP in Vertrel XF was injected. Three days later, a second ml of ~0.17M DP was injected. On the sixth day, the reaction mixture was added to ~30 ml of methanol. The resulting precipitate was filtered, sucked dry in the filter, and further dried for 16 hr under pump vacuum to give 0.71 g of product. Combustion analysis found 24.88% C, versus 25.24% C calculated for 1:1 poly(EVE: PDD).

After a sample of poly(EVE/PDD) was irradiated overnight at about 0.2 milliwatts/cm$^2$ UV intensity, it was no longer soluble in perfluorooctane.

EXAMPLE 7

Preparation and Photocrosslinking of Poly(EVE/TFE/PPVE)

A 400 ml autoclave was chilled to about −20° C., and 10 g of EVE dissolved in 100 ml of Vertrel XF, and 10 ml of ~0.2 M DP initiator in Vertrel XF were added. The autoclave was evacuated, and 50 g of tetrafluoroethylene was added. Shaking overnight, the pressure inside the autoclave reached a maximum of 84 psi at 6.5° C. after 22 min, and decreased to 0 psi at 20.9° C. at the end of the run 1043 min later. The damp white solid was transferred to a vacuum filter, rinsed in the filter with Vertrel XF, sucked dry in the filter, and further dried overnight in a 130° C. vacuum oven, giving 53.2 g of product.

A 1 g sample of poly(EVE/TFE/PPVE) was placed between two Kapton® sheets and heated for ten min between the platens of a 320° C. press before applying a force of 20,000 pounds for 22 min. This gave a hazy film ~3" in diameter and 4 to 5 mils thick. The film was cut in half and one half placed in a quartz box under N$_2$ where it was irradiated for about 65 hr at about 0.2 milliwatts/cm$^2$ UV intensity. Dynamic mechanical analysis of the exposed and unexposed halves of the polymer film at 245° C. found the exposed half of the film to be stiffer, with a higher modulus (34 MPa) than the unexposed half of the film (22 MPa).

EXAMPLE 8

Preparation and Photocrosslinking of Poly(8-CNVE/PDD/TFE)

An autoclave was chilled to about −20° C., and 4 g of 8-CNVE dissolved in 20 ml of Vertrel XF, 14.2 ml of PDD, and 5 ml of ~0.17 M DP initiator in Vertrel XF were added. The autoclave was evacuated, and 7 g of tetrafluoroethylene were added. Shaking overnight, the pressure inside the autoclave reached a maximum of 110 psi at 17.3° C. after 59 min, and decreased to 49 psi at 34.1° C. at the end of the run, 1000 min later. This gave a colorless gel. Drying under a N$_2$ flow and then for 43 hr under pump vacuum gave 27.8 g of polymer that had an inherent viscosity of 0.476 dL/g in hexafluorobenzene. $^{19}$F NMR was consistent with a polymer composition of 2.3 mole % 8-CNVE, 42.3 mole % TFE, and 53.4 mole % PDD; 2 mole % of unreacted 8-CNVE monomer was also detected. Tg was 106° C. (second heat, 10° C./min, N$_2$). The polymer made viscous, clear solutions when dissolved at 0.1 g/1 g hexafluorobenzene and 0.1 g/2 g of Fluorinert FC-40.

Rolling a 0.1 g sample of poly(8-CNVE/PDD/TFE) with 1 g of Fluorinert FC-40 gave an extremely viscous solution which was spotted on a glass microscope slide and air-dried to a film. The microscope slide, while in a quartz box under N$_2$, was irradiated for 71.5 hr with about ~0.2 milliwatts/cm$^2$ UV intensity. The recovered film sample of poly(8-CNVE/PDD/TFE) gave a swollen gel in Fluorinert FC-40.

EXAMPLE 9

Preparation and Photocrosslinking of Poly(8-CNVE/EVEOCN/PDD)

A small sample vial equipped with serum cap and magnetic stir bar was loaded with 2 ml 8-CNVE, 0.2 ml EVEOCN, and 1 ml of PDD while chilling on dry ice. The vial was flushed with N$_2$, and 0.5 ml of ~0.2 M DP in Vertrel XF was injected. The vial was allowed to warm to room temperature with magnetic stirring. The next morning, a second 0.05 ml of ~0.17M DP was injected. On the following day, the viscous reaction mixture was blown down with N$_2$, giving 4.1 g of white solid that had an inherent viscosity of 0.108 dL/g in Novec HFE-7500. $^{19}$F NMR was consistent with a polymer composition of 22.2 mole % 8-CNVE, 4.4 mole % EVEOCN, and 63.4 mole % PDD; 7.6 mole % of unreacted 8-CNVE monomer and 2.4 mole % of unreacted EVEOCN monomer were also detected. Tg was 115° C. (second heat, 10° C./min, $N_2$). The polymer made clear solutions when dissolved at 0.1 g/1 g of either hexafluorobenzene or Novec HFE-7500.

Rolling a 0.1 g sample of poly(8-CNVE/EVEOCN/PDD) with 1 g of Novec HFE-7500 gave a clear solution, which was spotted on a glass microscope slide and air-dried to a film. The microscope slide, while in a quartz box under $N_2$, was irradiated using a Rayonet Photochemical Reactor bulb. After 70.5 hr, a 0.021 g sample of film fragments showed no sign of solution or swelling with 1 g of Novec HFE-7500.

EXAMPLE 10

Very Fast Photocrosslinking of Poly(EVE/E), Poly(EVE/VF2), and Poly(EVE/TFE)

Lumps of poly(EVE/E), poly(EVE/VF2), and poly(EVE/TFE) weighing from ~0.2 to 0.4 g were spread on glass microscope slides by heating for 1 hr in a 120° C. oven.

The thick films were exposed to very high intensity UV light using a PulseForge™ flash lamp (NovaCentrix, Austin, Tex.). The exposures consisted of sixteen 80 microsecond exposures at increasingly high intensity, followed by 20 to 40 additional exposures at the highest intensity, each exposure lasting for 80 microseconds. After a total exposure time of 0.028 sec, the poly(EVE/E) broke into fragments (rather than dissolving) when rolled in 2-heptanone. After a total exposure time of 0.044 sec, the poly(VF2/EVE) swelled in 2-heptanone with a 92% weight gain when rolled with 2-heptanone. After a total exposure time of 0.028 sec, the poly(EVE/TFE) became a soft viscous gel rather than dissolving when rolled with hexafluorobenzene.

EXAMPLE 11

Preparation of Photocrosslinked Viton® Films

Viton® GAL200-S (DuPont) was dissolved in propyl acetate to make a 9.96 weight % solution. To 25 g of this solution were added 0.125 g of triallyl isocyanurate (TAIC, Aldrich) and 0.125 g of photoinitiator Irgacure® 651 (Ciba). The ingredients were stirred until a homogeneous solution was obtained. The solution was then filtered through a 0.45 micron PTFE syringe filter and some solvent evaporated using a rotary evaporator at room temperature to reduce the volume by 50% yielding a viscous liquid. Films were cast on microscope slides using this solution and, after air drying, they were crosslinked at 60° C. under nitrogen atmosphere using a Blak-Ray® B-100AP lamp (UVP, LLC. Upland, Calif.) for 15 minutes at 24 mW/cm$^2$ at 365 nm.

The index of refraction at D-line was 1.38 and the induced absorbance rate was less than or equal to 0 Abs/cm/(GJ/m$^2$)) at 3.8 kW/m$^2$ and was less than or equal to 0 at an irradiance of 52 kW/m$^2$.

EXAMPLE 12

Figure 14A:
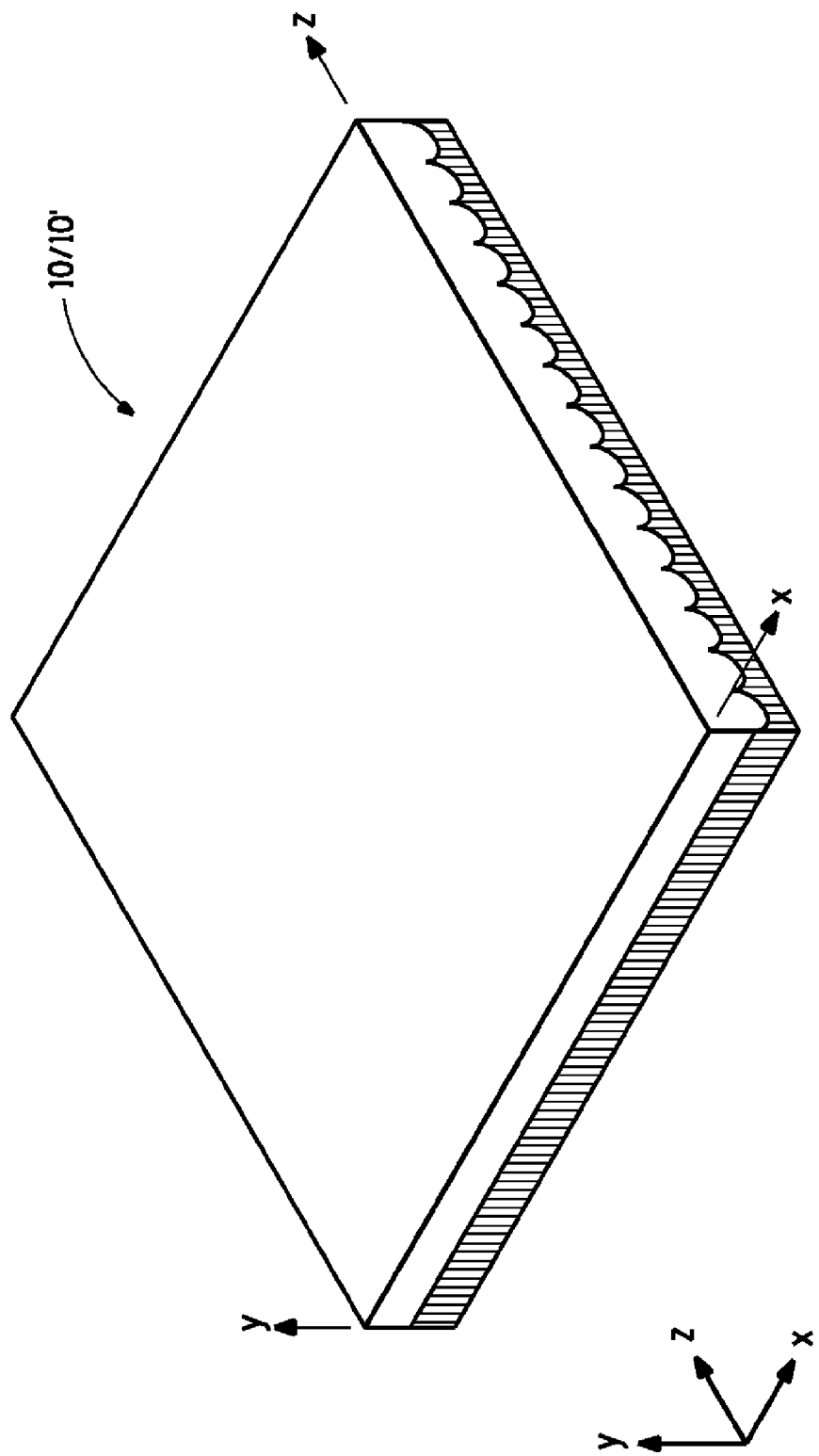
Figure 14B:
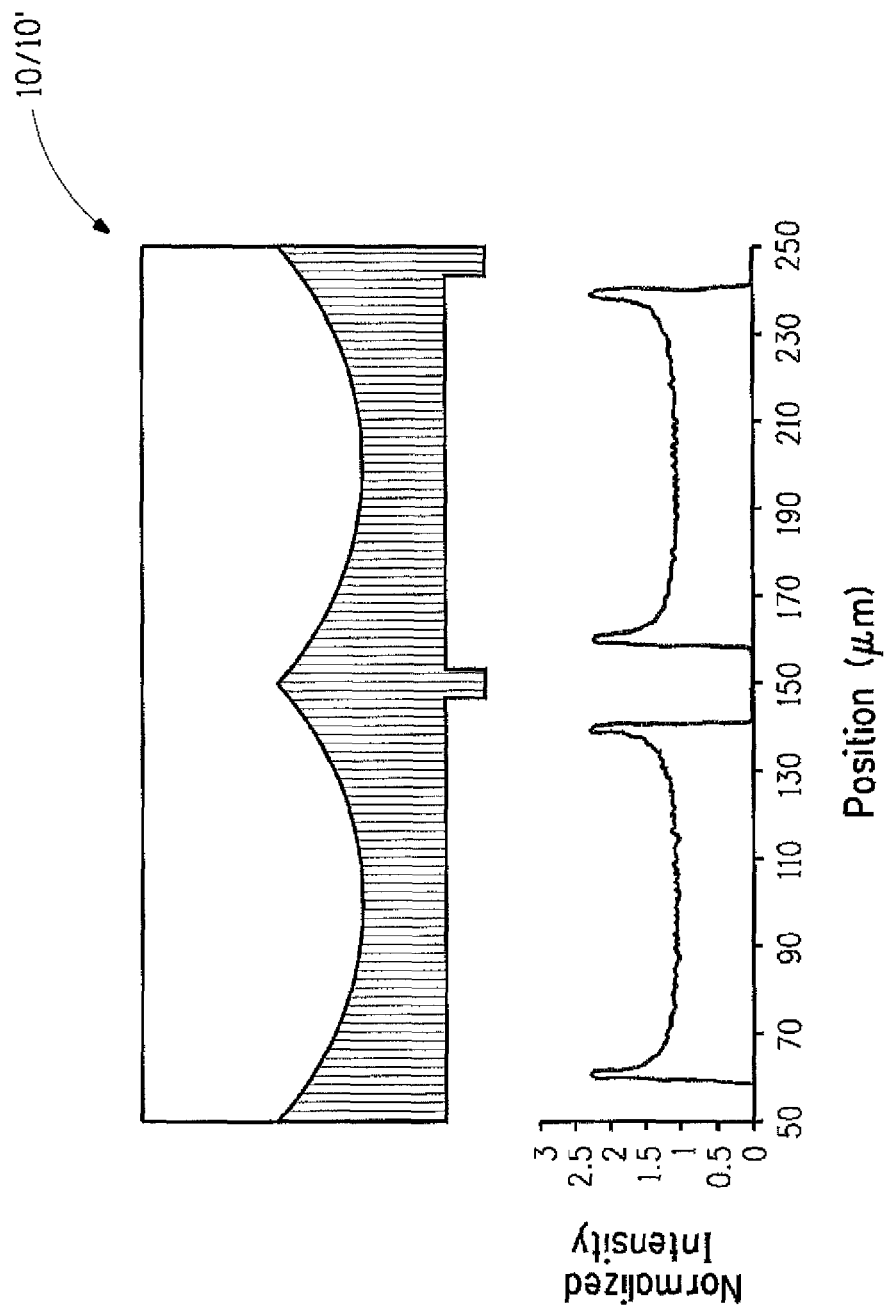
FIG. 14B is a portion of the cross section of this structure and the intensity profile.

A ray tracing model of a plano-piano structure using a lenticular array has been created with the cusps pointing up, toward the light source, and toward the higher index material. The repeat period is 100 micro meters, the index of refraction of the top layer is 1.506, and the index of refraction of the bottom layer is 1.34. The distance from the cusp apex point to the viewing plane is 50 micro meters. FIG. 14A is a 3-dimensional rendering of this structure. FIG. 14B shows a portion of the cross section of this structure and the intensity profile created by the ray tracing program, TracePro6.0®. The intensity profile is normalized by the intensity that would have been seen in the absence of the plano-piano structure. A merit function has been created as a measure of the integrated increase in intensity in the bright areas. In this case the merit function is 21.28% from the ray trace data compared to 21.95% from an optimistic design estimate. The parameter s is half the dark space length in the intensity profile. This measures to be 9 micro meters in this example.

EXAMPLE 13

Figure 15A:
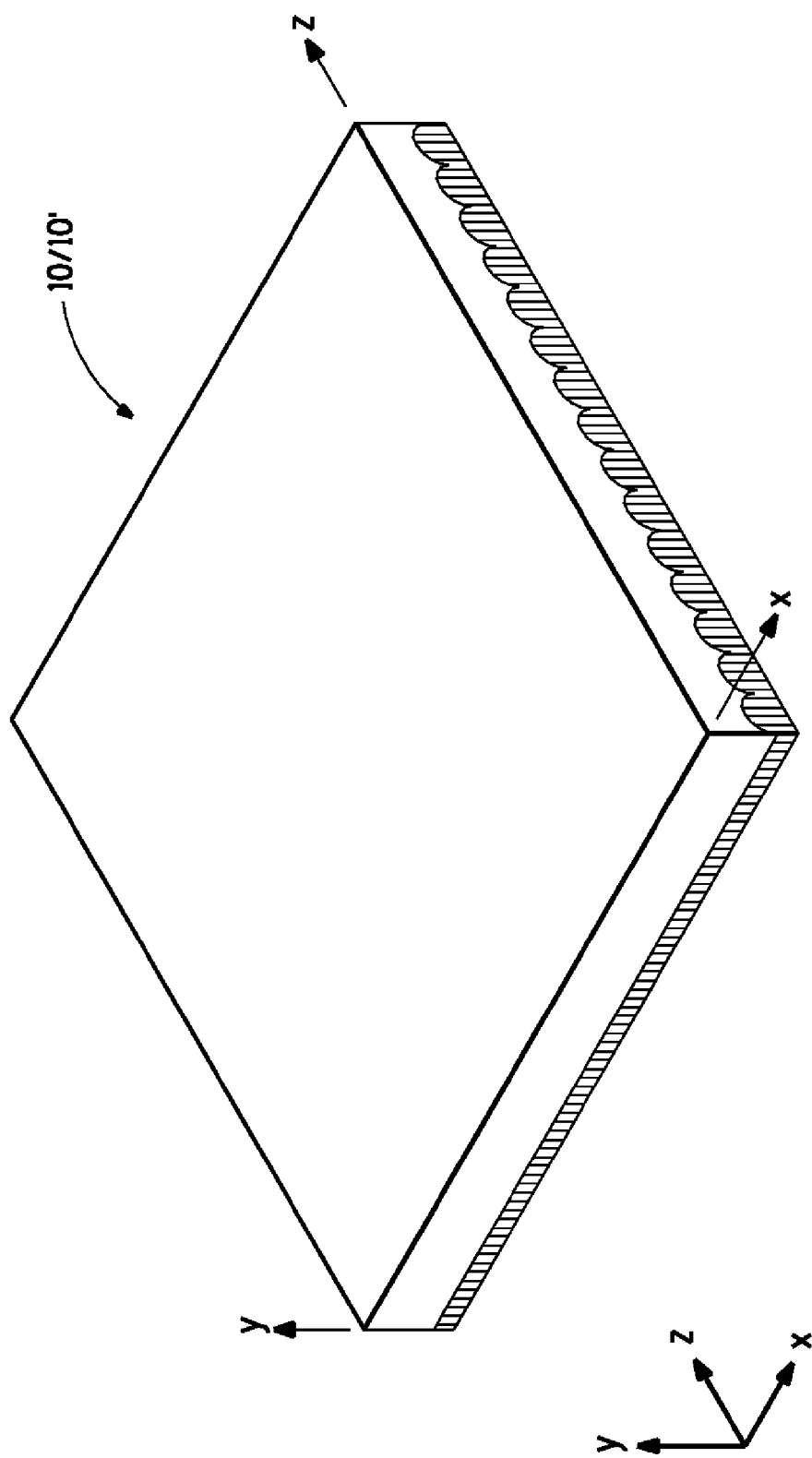
Figure 15B:
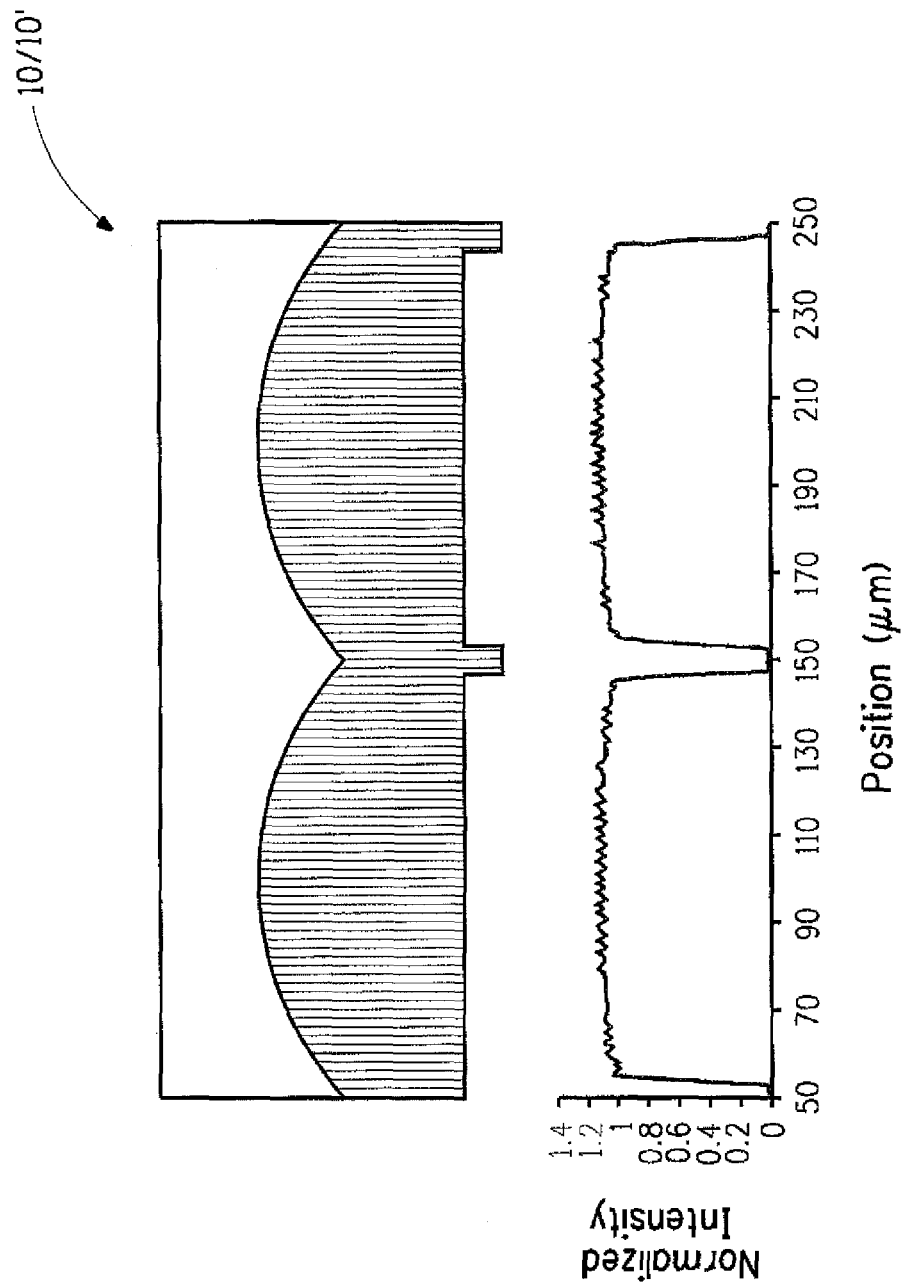
FIG. 15B is a portion of the cross section of this structure and the intensity profile.

A ray tracing model of a plano-piano structure using a lenticular array has been created with the cusps pointing down, away from the light source, and toward the higher index material. The repeat period is 100 micro meters, the index of refraction of the top layer is 1.34, and the index of refraction of the bottom layer is 1.506. The distance from the cusp apex point to the viewing plane is 26.5 micro meters. FIG. 15A is a 3-dimensional rendering of this structure. FIG. 15B shows a portion of the cross section of this structure and the intensity profile created by the ray tracing program, TracePro6.0®. The intensity profile is normalized by the intensity that would have been seen in the absence of the plano-piano structure. A merit function has been created as a measure of the integrated increase in intensity in the bright areas. In this case the merit function is 8.3% from the ray trace data. The parameter s is half the dark space length in the intensity profile. This measures to be 3 micro meters in this example.

EXAMPLE 14

Figure 16A:
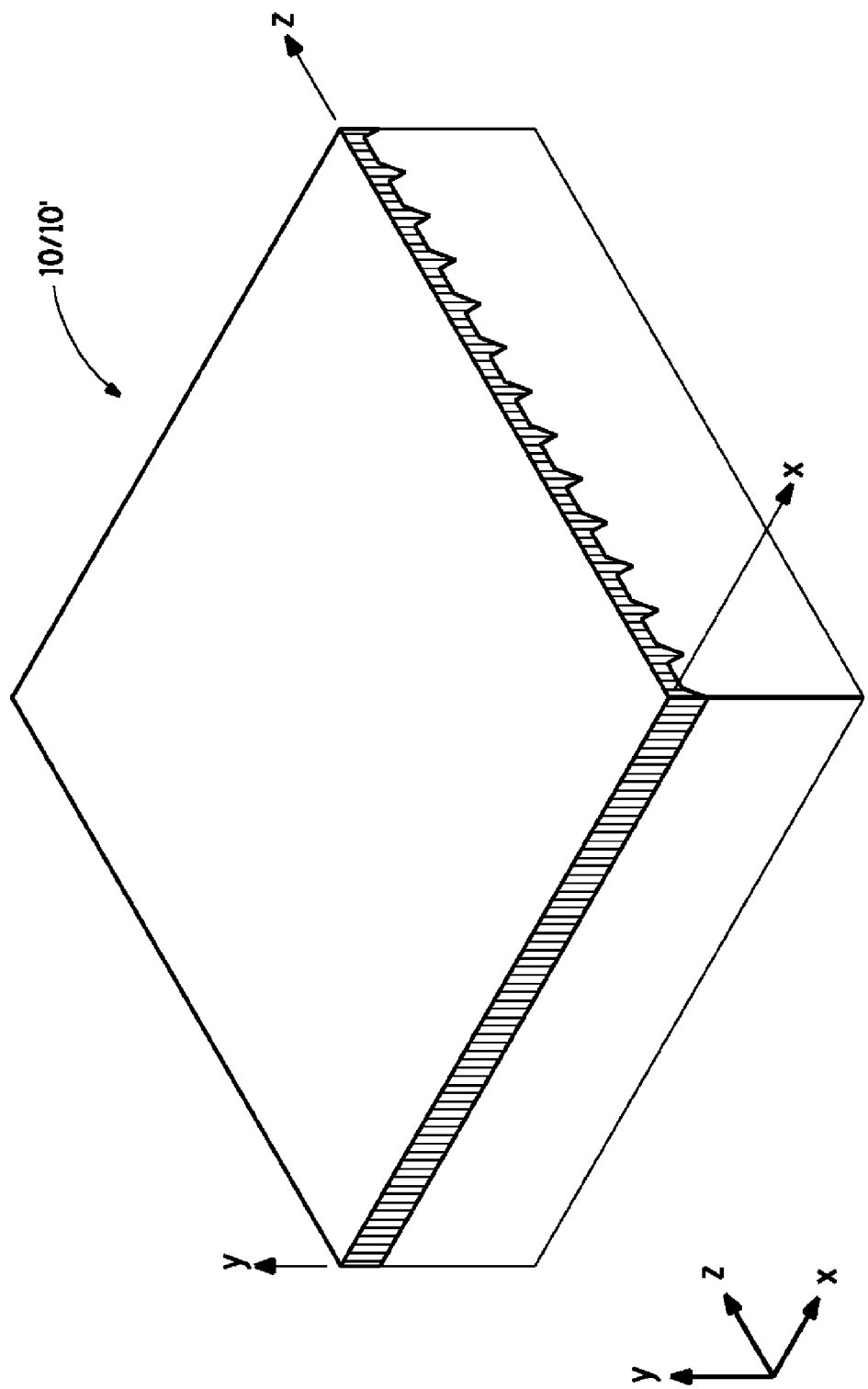
Figure 16B:
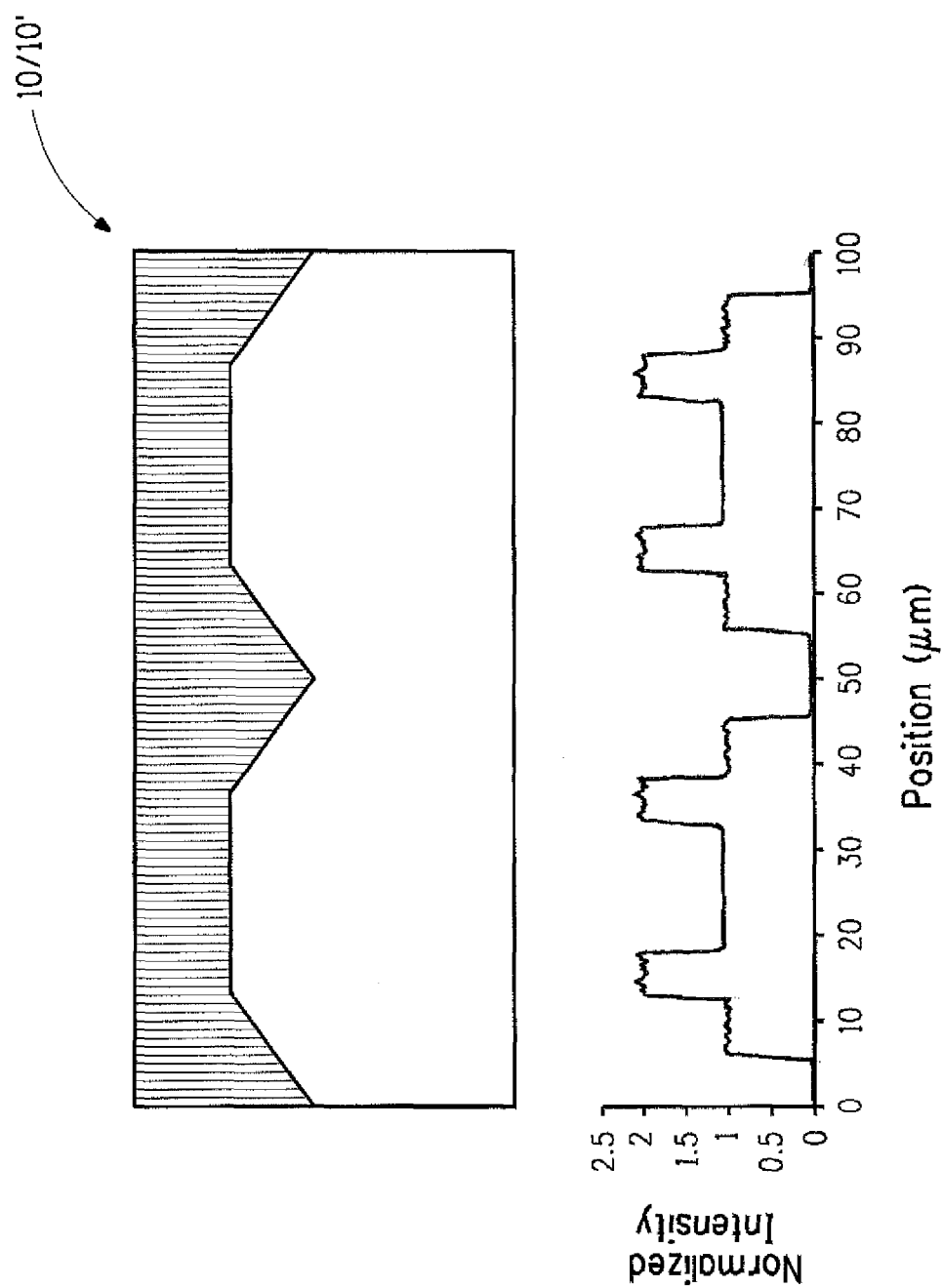
FIG. 16B is a portion of the cross section of this structure and the intensity profile.

A ray tracing model of a plano-piano structure using an array of prism structures has been created with the cusps pointing down, away from the light source, and toward the higher index material. The repeat period is 50 micro meters, the index of refraction of the top layer is 1.34, and the index of refraction of the bottom layer is 1.4. The cusp half angle is 45 degrees. The distance from the cusp apex point to the viewing plane is 119 micro meters. FIG. 16A is a 3-dimensional rendering of this structure. FIG. 16B shows a portion of the cross section of this structure and the intensity profile created by the ray tracing program, TracePro6.0®. The intensity profile is normalized by the intensity that would have been seen in the absence of the plano-piano structure. A merit function has been created as a measure of the integrated increase in intensity in the bright areas. In this case the merit function is 24.9% from the ray trace data compared to 25% from an optimistic design estimate. The parameter s is half the dark space length in the intensity profile. The value of s measured from the ray tracing intensity profile is 5 micro meters in this example, which is exactly that which is calculated from the design equations.

EXAMPLE 15

A physical example of a plano-piano structure using an array of prism structures has been created with the cusps pointing down, away from the light source, and toward the higher index material. A two-part silicone rubber (RTV-615 from Momentive Performance Materials Inc, Waterford, N.Y.) was prepared as follows: one part (0.25 g) of RTV-615-B and ten parts (2.5 g) of RTV-615-A were placed in a glass vial and mixed manually with a spatula until the mixture appeared homogenous. A small amount of this mixture was placed on the prismatic surface of a 2"×2" piece of Reflexitee® Collimating Film (RCF-90L-PT from Reflexite Display Optics, Rochester, N.Y.) and spread to completely cover the surface. The sample was placed in a vacuum oven at ~150 mm Hg at room temperature for about two hours until all the trapped air bubbles disappeared from the silicone layer. The sample was then placed in an oven at 100° C. for one hour to completely cure the silicone polymer. The bilayer film obtained was 520 micron thick.

Figure 17A:
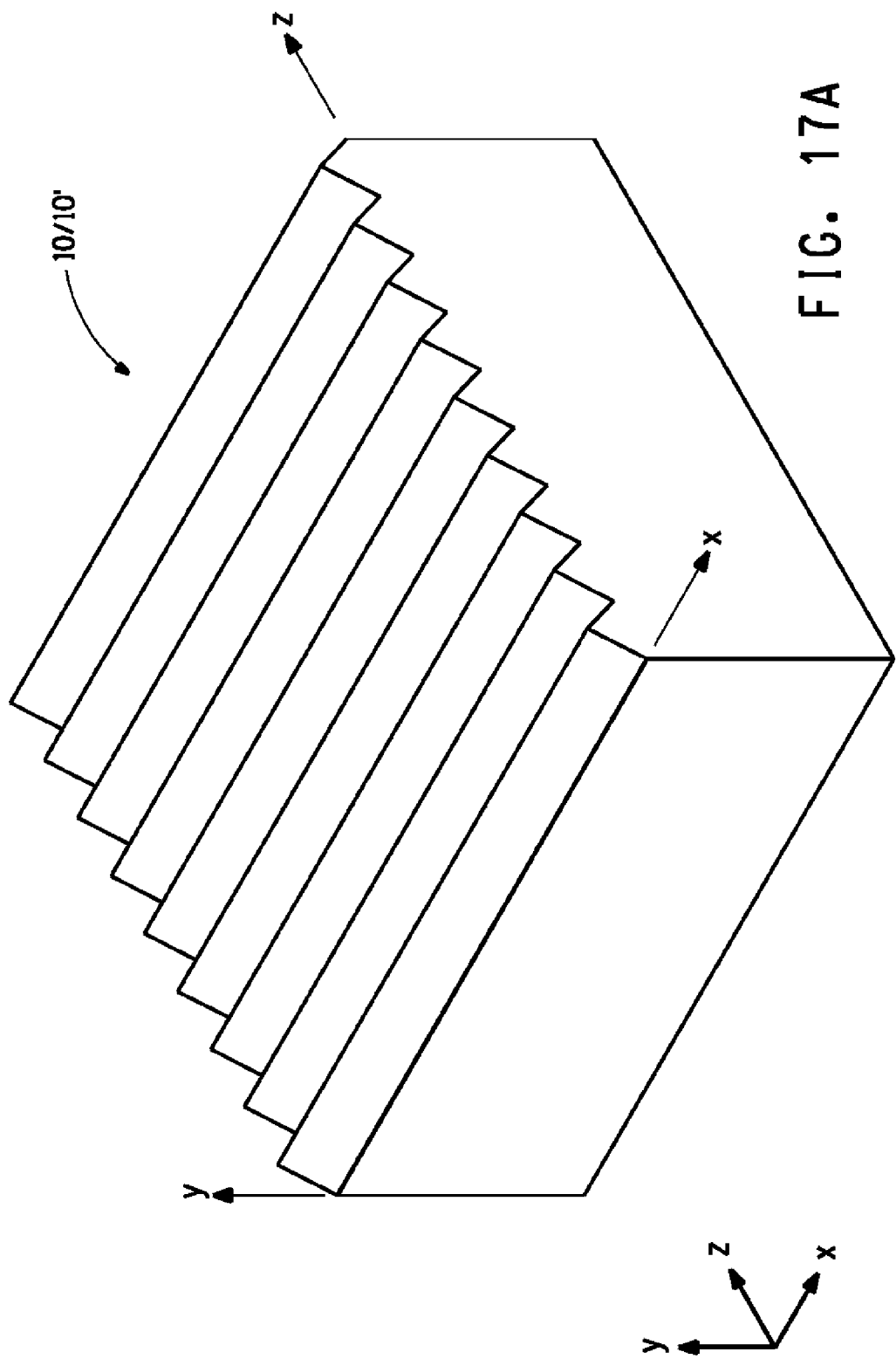
Figure 17B:
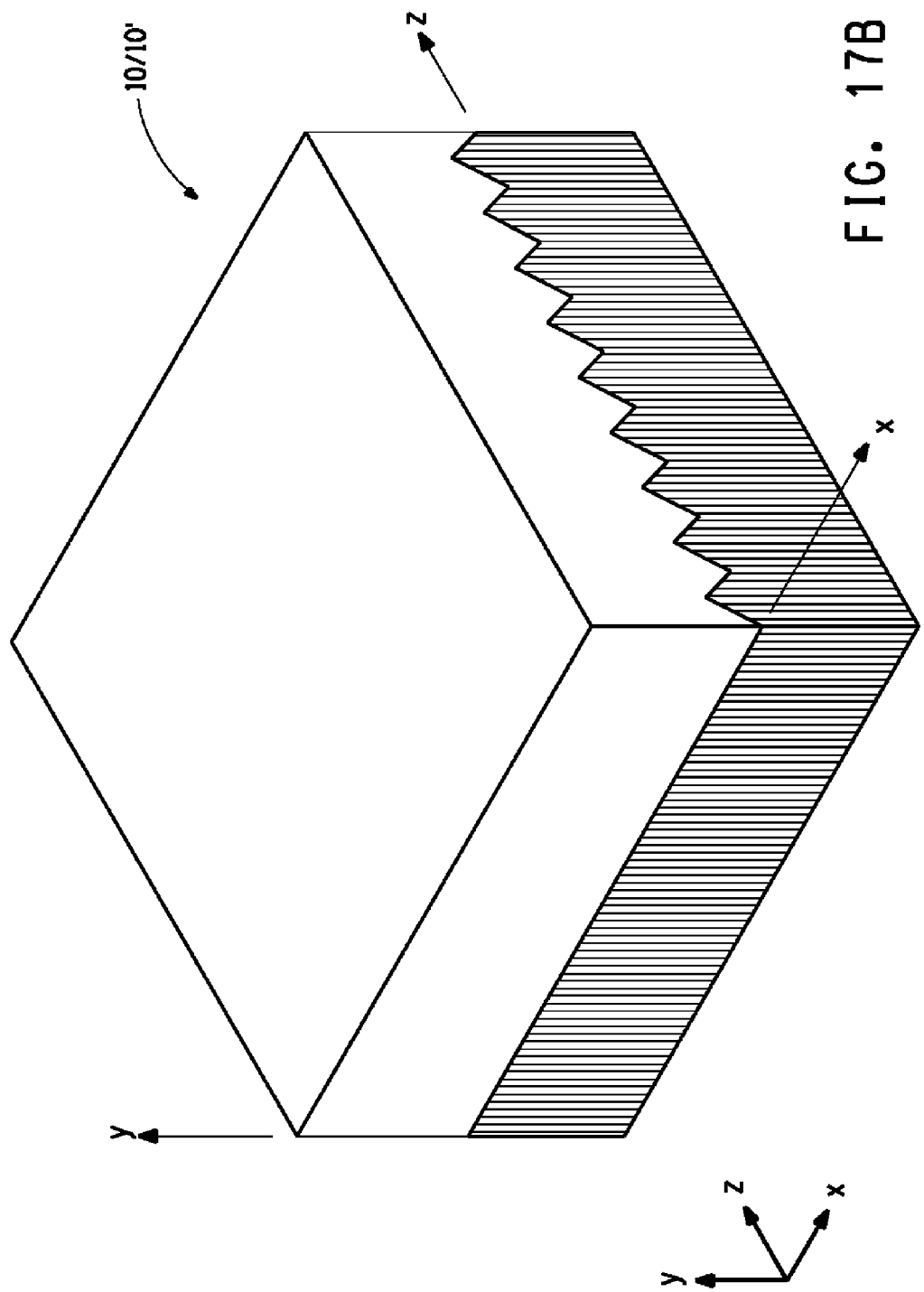
FIG. 17B is a three-dimensional rendering of the a portion of a Reflexite® film covered with a silicone polymer layer.
Figure 17C:
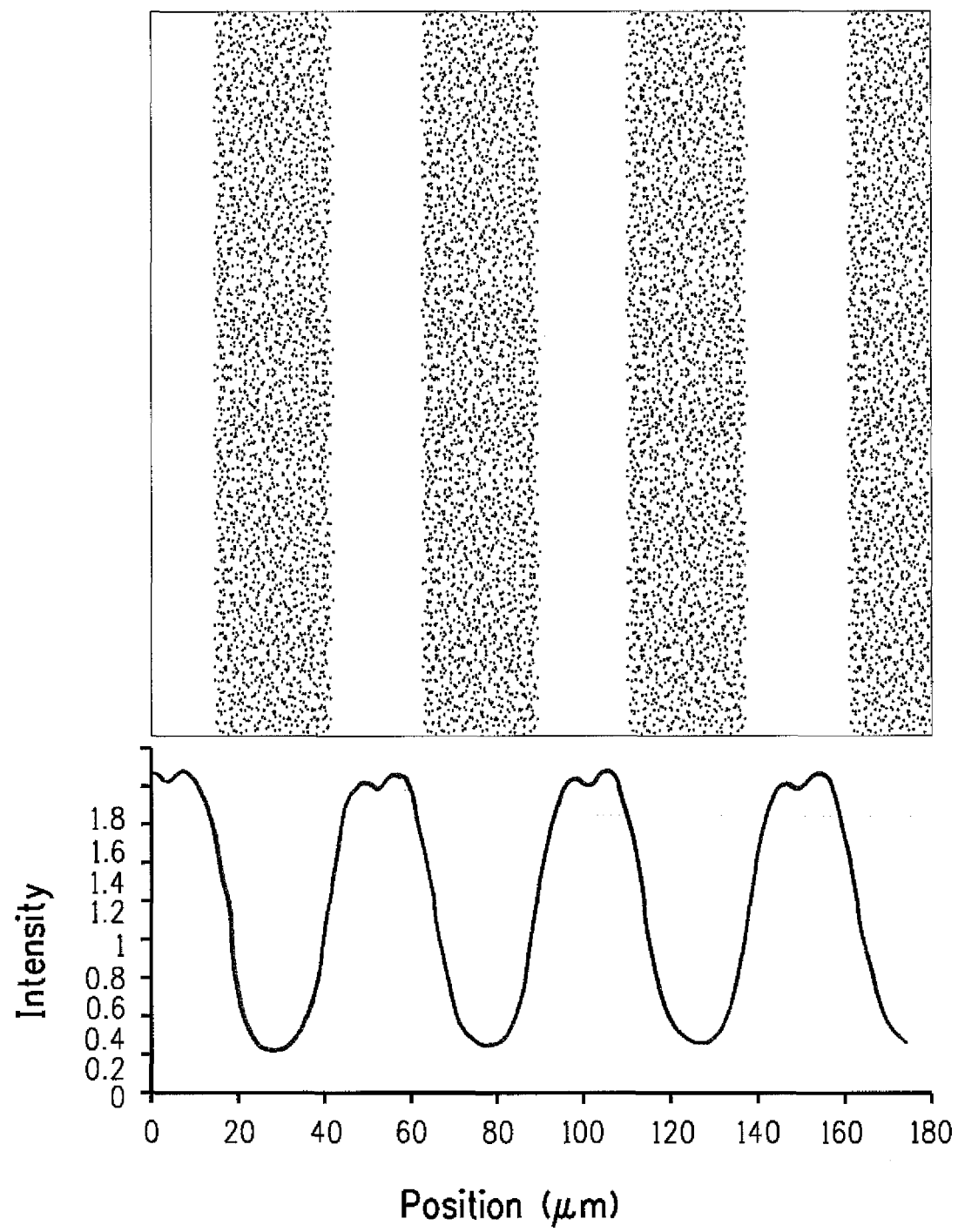
FIG. 17C is a portion of the cross section of this structure and the intensity profile.

A 3D rendering of a portion of the Reflexite® film is shown in FIG. 17A. The period of the saw tooth pattern at the top surface is about 48 microns, the depth of the saw-tooth pattern is about 24 microns, and the cusp angle with respect to the normal to the film plane is 45 degrees. A 3D rendering of a portion of the Reflexite® film covered with the silicone polymer layer is shown in FIG. 17B. In FIG. 17B the normal incident, plane parallel light enters the sample from the top, i.e., the side coated with the silicone polymer which has an index of refraction of about 1.40. The index of refraction of the Reflexite® film is higher than that of the silicone polymer. A microscope with a camera was used to capture the intensity profile created by the plano-piano structure. Referencing FIG. 17B, the microscope is looking up from the bottom of the sample into the light. The focal plane of the microscope was placed about 132 micro meters below the apex of the cusps pointing downward. FIG. 17C shows the micrograph of this intensity profile. The size of this image is about 172 by 230 micro meters. Exactly below the micrograph in FIG. 17C is a normalized intensity profile across the horizontal of this image. The intensity has been normalized to a white image taken at the same illumination but without the sample. A correction to the normalized intensity was introduced to compensate for top and bottom the surface reflections of the plano-piano structure. If we arbitrarily define the dark space created by this structure to be where the intensity drops below 0.6 of the illumination intensity, then the dark space measures from the intensity profile to be 17.8 micro meters. An optimistic estimate of the merit function of this design is 58.9%. This is calculated as 100*((period/bright distance)−1), where the period is 48 micro meters, and the bright distance in this case is (48−17.8) or 30.2 micro meters. A calculation of the merit function achieved from the intensity profile shown in FIG. 17C is 33.9%.

EXAMPLE 16

Figure 18:
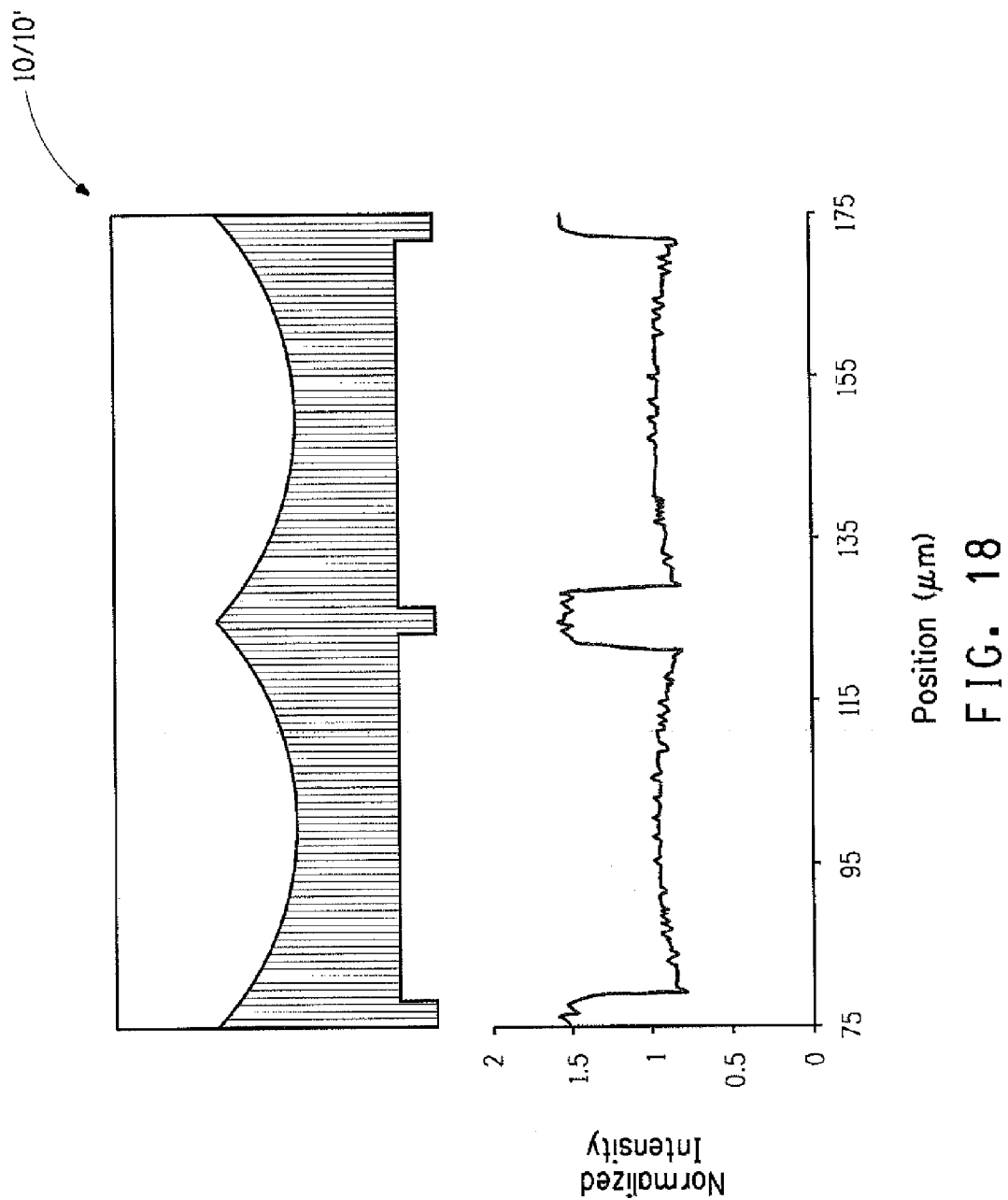
FIG. 18 is a portion of the cross section of the structure of Example 16 and the resulting intensity profile.

A ray tracing model of a plano-piano structure using a lenticular array has been created with the cusps pointing up, toward the light source, and toward the lower index material. The repeat period is 100 micro meters, the index of refraction of the top layer is 1.34, and the index of refraction of the bottom layer is 1.506. The distance from the cusp apex point to the viewing plane is 50 micro meters. The 3 dimensional rendering of this object is the same as for Example 12 as shown in FIG. 14A. The difference between the examples is that the index of refraction top to bottom has been reversed. FIG. 18 shows a portion of the cross section of this structure and the intensity profile created by the ray tracing program, TracePro6.0®. The intensity profile is normalized by the intensity that would have been seen in the absence of the plano-piano structure. The parameter s is half the bright space length in the intensity profile. This measures to be 3.5 micro meters in this example. This is of course not the optimal way of using this lens structure to concentrate light. For a lens structure one can do better using the lens as a focusing element. In Example 14 which was used as an example of creating a dark space one notices in FIG. 16 that bright spaces with concentration 2 are created below the cusp apexes that point upward toward the high index material. Other designs can reach a concentration of 3 where each pair of bright spots per period overlap. Furthermore, one can design structures where bright spots from multiple periods overlap to increase the concentration further.

Those skilled in the art, having the benefits of the teachings of the present invention as hereinabove set forth may effect numerous modifications thereto. It should be understood that such modifications lie within the contemplation of the present invention, as defined in the appended claims.

What is claimed is:

1. A display device comprising:
    a display panel having at least one light transmissive pixel element bounded on its periphery by a obscured region; and
    a piano-piano optical element having opposed, substantially planar first and second surfaces and mounted over the display panel, the optical element itself comprising:
        a body having a first portion and a second portion, the first portion being formed from a first material having an index of refraction $n_1$, the second portion being formed from a second material having an index of refraction of refraction $n_2$,
        one index of refraction being greater than the other index of refraction, with both indices of refraction being greater than the index of refraction of air,
        both the first and second materials being fluorine-containing polymers or copolymers having an induced absorbance rate $\Delta Abs/Dose$ less than or equal to about 0.4 per cm per $GJ/m^2$ dose when measured at a solar irradiance of 4 $kW/m^2$,
        one of the first and second surfaces being formed on each of the portions of the body,
        the first and second portions being arranged such that an interface with at least one cusp is defined within the optical element between the first and second materials,
        the cusp having an apex pointed toward the material having the lesser index of refraction,
        the cusp being operative to redirect and to produce a region of modulated light exiting one surface of the optical element in response to light incident on the other surface of the optical element,
        the region of modulated light being aligned with the obscured region bounding the periphery of the display.

2. The display device of claim 1 wherein the first and second materials of the optical element have an index contrast "c" defined by the relationship:

$$c = \log_{10} n_R, \text{ where } n_R = (n_1/n_2), \text{ wherein}$$

the absolute value of c lies within the range from about 0.001 to about 0.17, such that $$0.001 < |c| < 0.17.$$

3. The display device of claim 2 wherein the absolute value of "c" lies within the range from about 0.01 to about 0.05, such that $$0.01 < |c| < 0.05.$$

4. The display device of claim 1 wherein the materials have an induced absorbance rate $\Delta Abs/Dose$ less than or equal to about 0.2 per cm per $GJ/m^2$ dose when measured at a solar irradiance of 4 $kW/m^2$.

5. The display device of claim 1 wherein the display panel is a liquid crystal display ("LCD") panel.

6. The display device of claim 1 wherein the display panel is a light emitting diode ("LED") display panel.

7. The display device of claim 1 wherein the display panel is an organic light emitting diode ("OLED") display panel.

8. An LED lighting device comprising:
   a light emitting diode operative to emit spatially modulated light; and
   a plano-plano optical element having opposed, substantially planar first and second surfaces and aligned in a light receptive relationship with the light emitting diode, the optical element itself comprising:
      a body having a first portion and a second portion, the first portion being formed from a first material having an index of refraction $n_1$, the second portion being formed from a second material having an index of refraction of refraction $n_2$,
      one index of refraction being greater than the other index of refraction, with both indices of refraction being greater than the index of refraction of air,
      both the first and second materials being fluorine-containing polymers or copolymers having an induced absorbance rate $\Delta Abs/Dose$ less than or equal to about 0.4 per cm per $GJ/m^2$ dose when measured at a solar irradiance of 4 $kW/m^2$,
      one of the first and second surfaces being formed on each of the portions of the body,
      the first and second portions being arranged such that an interface with at least one cusp is defined within the optical element between the first and second materials,
      the cusp having an apex pointed toward the material having the lesser index of refraction,
      the cusp being operative to redirect spatially modulated light emitted from the light emitting diode incident on one surface of the optical element, thereby to produce less spatially modulated light exiting the other surface of the optical element.

9. The LED lighting device of claim 8 wherein the first and second materials of the optical element have an index contrast "c" defined by the relationship:

$$c = \log_{10} n_R, \text{ where } n_R = (n_1/n_2), \text{ wherein}$$

the absolute value of c lies within the range from about 0.001 to about 0.17, such that $$0.001 < |c| < 0.17.$$

10. The LED lighting device of claim 9 wherein the absolute value of "c" lies within the range from about 0.01 to about 0.05, such that $$0.01 < |c| < 0.05.$$

11. The LED lighting device of claim 8 wherein the materials have an induced absorbance rate $\Delta Abs/Dose$ less than or equal to about 0.2 per cm per $GJ/m^2$ dose when measured at a solar irradiance of 4 $kW/m^2$.

12. The LED lighting device of claim 9, wherein the induced absorbance rate $\Delta Abs/Dose$ is less than or equal to about 0.2 per cm per $GJ/m^2$ dose when measured at a solar irradiance of 4 $kW/m^2$.

* * * * *